United States Patent
Gross et al.

(10) Patent No.: US 7,642,484 B2
(45) Date of Patent: Jan. 5, 2010

(54) MULTIPLE BEAM MICRO-MACHINING SYSTEM AND METHOD

(75) Inventors: Abraham Gross, Ramat Aviv (IL); Zvi Kotler, Tel Aviv (IL); Eliezer Lipman, Rishon Lezion (IL)

(73) Assignee: Orbotech Ltd, Yavne (IL)

( * ) Notice: Subject to any disclaimer, the term of this patent is extended or adjusted under 35 U.S.C. 154(b) by 0 days.

(21) Appl. No.: 10/170,212

(22) Filed: Jun. 13, 2002

(65) Prior Publication Data

US 2003/0019854 A1 Jan. 30, 2003

Related U.S. Application Data

(60) Provisional application No. 60/297,453, filed on Jun. 13, 2001.

(51) Int. Cl.
 *B23K 26/06* (2006.01)
(52) U.S. Cl. .............................. 219/121.73; 219/121.7
(58) Field of Classification Search ............. 219/121.7, 219/121.71, 121.73, 121.74, 121.8; 427/455, 427/454
See application file for complete search history.

(56) References Cited

U.S. PATENT DOCUMENTS

| | | | |
|---|---|---|---|
| 3,594,081 A | 7/1971 | Tschink ........................ 355/67 |
| 4,038,108 A * | 7/1977 | Engel et al. ............ 219/121.72 |
| 4,258,468 A | 3/1981 | Balde ........................... 29/830 |
| 4,279,472 A * | 7/1981 | Street ....................... 250/201.1 |
| 4,447,291 A | 5/1984 | Schulte ....................... 156/643 |
| 4,602,852 A | 7/1986 | Moroz | |
| 4,784,449 A | 11/1988 | Auracher et al. | |
| 4,833,681 A | 5/1989 | Akiyama et al. | |
| 5,055,653 A | 10/1991 | Funami et al. | |
| 5,302,798 A | 4/1994 | Inagawa et al. | |
| 5,309,178 A | 5/1994 | Gross | |
| 5,404,247 A | 4/1995 | Cobb et al. | |
| 5,408,553 A | 4/1995 | English, Jr. et al. | |
| 5,475,416 A | 12/1995 | Kessler et al. | |
| 5,593,606 A | 1/1997 | Owen et al. ............ 219/121.71 |
| 5,614,114 A | 3/1997 | Owen ..................... 219/121.66 |
| 5,674,414 A | 10/1997 | Schweizer ............. 219/121.77 |
| 5,676,866 A | 10/1997 | in den Bäumen et al. ..................... 219/121.77 |
| 5,690,845 A | 11/1997 | Fuse ..................... 219/121.74 |
| 5,789,121 A | 8/1998 | Cywar et al. ................... 430/9 |
| 5,837,962 A | 11/1998 | Overbeck | |

(Continued)

FOREIGN PATENT DOCUMENTS

DE 19801364 A1 7/1999

(Continued)

OTHER PUBLICATIONS

U.S. Appl. No. 10/167,472, filed Jun. 13, 2002, Gross et al.

(Continued)

*Primary Examiner*—M. Alexandra Elve
(74) *Attorney, Agent, or Firm*—Sughrue Mion, PLLC

(57) ABSTRACT

A system for delivering energy to a substrate including a dynamically directable source of radiant energy providing a plurality of beams of radiation, each propagating in a dynamically selectable direction. Independently positionable beam steering elements in a plurality of beam steering elements are operative to receive the beams and direct them to selectable locations on the substrate.

59 Claims, 10 Drawing Sheets

U.S. PATENT DOCUMENTS

| | | | |
|---|---|---|---|
| 5,841,099 A | 11/1998 | Owen et al. | 219/121.69 |
| 5,933,216 A | 8/1999 | Dunn | 355/53 |
| 5,942,136 A | 8/1999 | Mori et al. | |
| 5,948,288 A | 9/1999 | Treves et al. | |
| 5,948,291 A | 9/1999 | Neylan et al. | 219/121.77 |
| 5,969,877 A | 10/1999 | Maeda | |
| 5,973,290 A | 10/1999 | Noddin | |
| 6,037,564 A * | 3/2000 | Tatah | 219/121.7 |
| 6,040,552 A | 3/2000 | Jain et al. | 219/121.7 |
| 6,058,132 A | 5/2000 | Iso et al. | 372/108 |
| 6,172,331 B1 * | 1/2001 | Chen | 219/121.71 |
| 6,184,490 B1 | 2/2001 | Schweizer | |
| 6,233,044 B1 | 5/2001 | Brueck et al. | |
| 6,252,667 B1 | 6/2001 | Hill et al. | 356/487 |
| 6,275,514 B1 | 8/2001 | Katzir et al. | |
| 6,295,171 B1 | 9/2001 | Chao et al. | 359/813 |
| 6,313,918 B1 | 11/2001 | Hill et al. | 356/498 |
| 6,329,634 B1 | 12/2001 | Schweizer | |
| 6,376,799 B1 | 4/2002 | Amako et al. | |
| 6,423,935 B1 | 7/2002 | Hackel et al. | |
| 6,452,132 B1 | 9/2002 | Fuse | |
| 6,462,306 B1 | 10/2002 | Kitai et al. | |
| 6,462,307 B1 | 10/2002 | Hennig et al. | |
| 6,491,361 B1 * | 12/2002 | Spann | 347/2 |
| 6,515,257 B1 * | 2/2003 | Jain et al. | 219/121.73 |
| 6,521,866 B1 | 2/2003 | Arai et al. | |
| 6,566,627 B2 * | 5/2003 | Brandinger et al. | 219/121.69 |
| 6,605,796 B2 | 8/2003 | Brandinger et al. | |
| 6,674,564 B2 | 1/2004 | Vernackt et al. | |
| 6,972,392 B2 | 12/2005 | Kurosawa et al. | |
| 2001/0030176 A1 | 10/2001 | Sun et al. | |
| 2001/0045690 A1 | 11/2001 | Brandinger | |
| 2002/0166845 A1 | 11/2002 | Cordingley et al. | |

FOREIGN PATENT DOCUMENTS

| | | |
|---|---|---|
| EP | 1095726 | 7/2000 |
| EP | 1049559 B1 | 11/2000 |
| EP | 1224999 | 4/2001 |
| JP | 55081095 B1 | 6/1980 |
| JP | 8047789 B1 | 2/1996 |
| JP | 10229266 B1 | 8/1998 |
| KR | 1996-0033636 A | 10/1996 |
| KR | 1997-0033388 B1 | 7/1997 |
| WO | WO 00/64623 | 11/2000 |

OTHER PUBLICATIONS

U.S. Appl. No. 60/387,911, filed Jun. 13, 2002, Gross et al.

Mignardi et al. "The Digital Micromirror Device—a Micro-Optical Electromechanical Device for Display Applications", MEMS and MOEMS Technology and Applications, SPIE Press, 2000.

Owen, Mark, New Technology for Drilling Through -and Blind-Vias in Copper Clad Reinforced Circuit Boards, IPC Proceedings, May 1995.

Lee, Rex A. and Moreno, W.A., Excimer vs. ND:YAG Laser Creation of Silicon Vias for 3D Interconnects, IEEE, 1992, pp. 358-360.

* cited by examiner

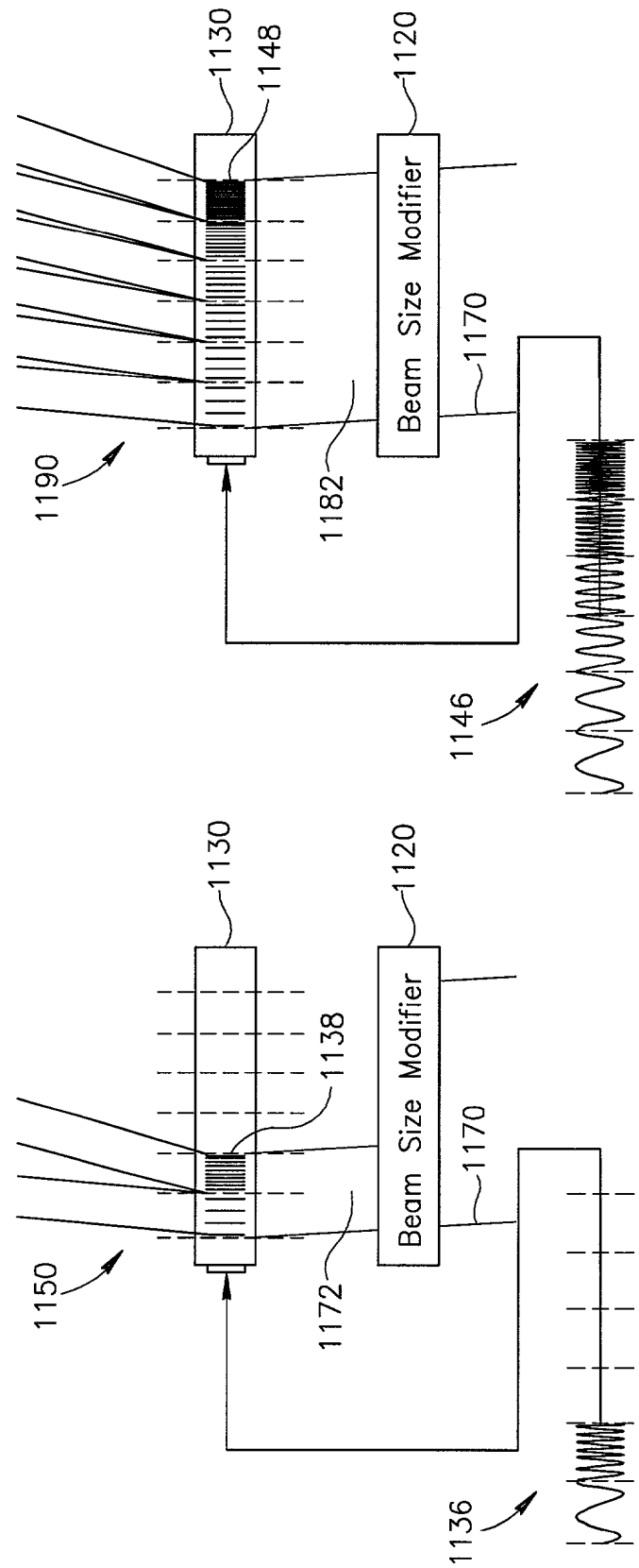

MULTIPLE BEAM MICRO-MACHINING SYSTEM AND METHOD

CROSS REFERENCE TO RELATED APPLICATION

This application claims the benefit of U.S. Provisional Patent Application No. 60/297,453, filed Jun. 13, 2001, the disclosure of which is incorporated by reference in its entirety.

FIELD OF THE INVENTION

The present invention generally relates to multiple laser beam positioning and energy deliver systems, and more particularly to laser micro-machining systems employed to form holes in electrical circuit substrates.

BACKGROUND OF THE INVENTION

Various laser machining devices are used to micro-machine patterns in substrates. Such systems typically are used in the manufacture of electrical circuit boards. Electrical circuit board manufacture comprises depositing conductive elements, such as conductive lines and pads, on a non-conductive, typically dielectric, substrate. Several such substrates are adhered together to form an electrical circuit board. In order to provide electrical interconnection between the various layers of an electrical circuit board, holes, called vias, are drilled through selected substrate layers and plated with a conductor. Electrical circuit boards typically include tens of thousands of vias, and as many as several hundred thousand vias.

SUMMARY OF INVENTION

The present invention seeks to provide an improved laser micro-machining apparatus, such apparatus being particularly useful to form vias in electrical circuit boards.

The present invention still further seeks to provide an improved laser beam positioning system operative to provide generally simultaneous independent positioning of a plurality of laser beams.

The present invention still further seeks to provide laser micro-machining apparatus employing a laser beam positioning system operative to provide simultaneous independent positioning of a plurality of laser beams.

The present invention still further seeks to provide laser micro-machining system operative to independently position a plurality of pulsed laser beams, with a minimal loss in laser energy.

The present invention still further seeks to provide laser micro-machining apparatus that efficiently utilizes laser energy supplied by a pulsed laser, such as a solid state Q-switched laser, to generate vias in electrical circuit substrates.

The present invention still further seeks to provide laser micro-machining apparatus that controls an energy property of a laser beam by splitting an input laser beam into at least one output beams that are used to micro-machine a substrate. The at least one output beams may be a single beam or a plurality of beams.

The present invention still further seeks to provide a dynamic beam splitter operative to split an input laser beam into a selectable number of output sub-beams.

The present invention still further seeks to provide a dynamic beam splitter operative to selectably split an input laser beam into a plurality of sub-beams having a generally uniform energy property.

The present invention still further seeks to provide a system for selectably deflecting a pulsed beam to a selectably positionable beam reflector pre-positioned in an orientation to suitable for delivering energy to a selectably location on a substrate. Deflection of the beam may be performed at a duty cycle which is at least as fast as a pulse repetition of the laser beam. Positioning of the reflector is performed at a duty cycle which is slower than the pulse repetition rate.

The present invention still further seeks to provide a dynamic beam splitter operative to split an input laser beam into a plurality of output laser beams, each of which is directed in a selectable direction. In accordance with an embodiment of the invention, each of the output laser beams is emitted from a different spatial section of the beam splitter.

The present invention still further seeks to provide a laser beam diverter operative to receive a plurality of laser beams generally propagating in a common plane, and to divert each of the laser beams to a location in a two-dimensional array of locations outside the plane.

In accordance with a general aspect of an embodiment of the present invention, a laser beam positioning system, useful for example, to micro-machine substrates, is operative to provide a plurality of sub-beams which are dynamically deflected in a selectable direction. Each sub-beam is deflected so as to impinge on a deflector, located in an array of independently positionable deflector, whereat the sub-beams are further deflected by the deflectors to impinge on a substrate at a selectable location. In accordance with an embodiment of the invention, the plurality of sub-beams is generated from a single input beam by a dynamically controllable beam splitter.

In accordance with a general aspect of an embodiment of the invention, a system for delivering energy to a substrate, includes a dynamically directable source of radiant energy providing a plurality of beams of radiation, propagating in a dynamically selectable direction. Independently positionable beam steering elements in a plurality of beam steering elements are operative to receive the beams and direct them to selectable locations on the substrate.

In accordance with another general aspect of an embodiment of the invention a system for delivering energy to a substrate comprises at least one source of radiant energy providing a beam of radiation, a beam splitter operative to split the beam into a plurality of sub-beams, each sub-beam propagating in a selectable direction, and a plurality of independently positionable beam steering elements, some of which receive the plurality of sub-beams and direct them to selectable locations on the substrate.

In accordance with another general aspect of an embodiment of the invention a system for delivering energy to a substrate comprises at least one source of radiant energy providing a beam of radiation and a dynamically configurable beam splitter disposed between the source of radiant energy and the substrate.

In accordance with another general aspect of an embodiment of the invention a system for delivering energy to a substrate comprises at least one source of radiant energy providing a beam of radiation and an opto-electronic multiple beam generator disposed between the source of radiant energy and the substrate. The multiple beam generator is operative to generate at least two sub-beams from the beam and to select an energy density characteristic of each sub-beam.

In accordance with another general aspect of an embodiment of the invention a system for delivering energy to a substrate comprises at least one source of pulsed radiant energy providing a pulsed beam of radiation along an optical axis, the pulsed beam including multiple pulses separated by a temporal pulse separation, and a multiple beam, selectable and changeable angle output beam splitter disposed between the source of radiant energy and the substrate. The selectable and changeable angle output beam splitter is operative to output a plurality of sub-beams at a selected angle relative to the optical axis. The angle is changeable in an amount of time that is less than the temporal pulse separation.

In accordance with another general aspect of an embodiment of the invention a system for delivering energy to a substrate comprises at least one source of pulsed radiant energy providing a pulsed beam of radiation, the pulsed beam including multiple pulses separated by a temporal pulse separation, a beam splitter disposed between the source of radiant energy and a substrate, the beam splitter being operative to output a plurality of sub-beams at selectable angles which are changeable, and a plurality of selectable spatial orientation deflectors. The deflectors are operative to change a spatial orientation in an amount of time that is greater than the temporal pulse separation. Some of the spatial orientation deflectors are arranged to receive the sub-beams and to direct the sub-beams to the substrate.

In accordance with another general aspect of an embodiment of the invention a system for delivering energy to a substrate comprises at least one source of radiant energy providing a beam of radiation, a beam splitter operative to split the beam into a selectable number of output beams, the output beams having an energy property functionally related to the selectable number, a beam steering element receiving an output beam and directing the output beam to micro-machine a portion of a substrate.

In accordance with another general aspect of an embodiment of the invention a system for delivering energy to a substrate comprises at least one source of radiant energy providing a plurality of beams of radiation propagating in a plane and a plurality of deflectors receiving the plurality of beams and deflecting at least some of the beams to predetermined locations outside the plane.

In accordance with another general aspect of an embodiment of the invention a system for delivering energy to a substrate comprises at least one source of radiant energy providing a beam of radiation, a beam splitter operative to receive the beam and to output a plurality of sub-beams propagating in a plane, and a plurality of deflectors receiving the plurality of sub-beams and deflecting at least some of the plurality of sub-beams to predetermined locations outside the plane.

In accordance with another general aspect of an embodiment of the invention a method for delivering energy to a substrate comprises directing a first plurality of beams of radiation onto a first plurality of selectably positionable deflectors during a first time interval for directing the first plurality of beams onto a first plurality of locations, during the first time interval, selectably positioning a second plurality of selectably positionable deflectors, and during a second time interval, directing the first plurality of beams of radiation onto the second plurality of selectable positionable deflectors for directing the first plurality of beams onto a second plurality of locations.

In accordance with another general aspect of an embodiment of the invention a system for delivering energy to a substrate comprises at least one radiant beam source providing at least one beam of radiation and at least first and second deflectors disposed to receive the at least one beam to deliver the beam to respective at least first and at least partially overlapping locations on the substrate.

In accordance with another general aspect of an embodiment of the invention a laser micro-machining apparatus includes at least one radiant beam source providing a plurality of radiation beams, a plurality of independently positionable deflectors disposed between the at least one radiant beam source and a substrate to be micro-machined, the plurality of independently positionable deflectors being operative to independently deliver the at least one radiation beam to selectable locations on the substrate, and a focusing lens disposed between the at least one radiant beam source and the substrate, the focusing lens receiving the plurality of radiation beams and being operative to simultaneously focus the beams onto the selectable locations on the substrate.

In accordance with another general aspect of an embodiment of the invention an acousto-optical device includes an optical element receiving a beam of radiation along an optical axis, and a transducer associated with the optical element, the transducer forming in the optical element an acoustic wave simultaneously having different acoustic frequencies, the optical element operative to output a plurality of sub-beams at different angles with respect to the optical axis.

In accordance with another general aspect of an embodiment of the invention a method for micro-machining a substrate includes providing a laser beam to a beam splitter device, splitting the laser beam into a first number of output beams and directing the first number of output beams to form at least one opening in a first layer of a multi-layered substrate, and then splitting the laser beam into a second number of output beams and directing ones of the second number of output beams to remove selected portions of a second layer of the multi-layered substrate via the at least one opening.

Additional features and aspects of the invention include various combinations of one or more of the following:

The source of radiant energy comprises a pulsed source of radiant energy outputting a plurality of beams each defined by pulses of radiant energy.

The pulsed source of radiant energy comprises at least one Q-switched laser.

A dynamically directable source of radiant energy comprises a beam splitter operative to receive a beam of radiant energy and splitting the beam into a selectable number of sub-beams.

A dynamically directable source of radiant energy comprises a beam splitter operative to receive a beam of radiant energy, to split the beam into a plurality of sub-beams and to direct the sub-beams each selectable directions.

The beam splitter comprises an acousto-optical deflector whose operation is governed by a control signal.

The beam splitter comprises an acousto-optical deflector having an acoustic wave generator controlled by a control signal, the acoustic wave generator generating an acoustic wave which determines the number of sub-beams output by the acousto-optical deflector.

The beam splitter comprises acousto-optical deflector having an acoustic wave generator controlled by a control signal, the acoustic wave generator generating an acoustic wave which determines the selectable directions of the sub-beams.

The acoustic wave in the acousto-optical deflector includes a plurality of spatially distinct acoustic wave segments, each spatially distinct acoustic wave segment being defined by a portion of the control signal having a distinct frequency.

Each spatially distinct acoustic wave segment in the acoustic wave determines a corresponding spatially distinct direction of a corresponding sub-beam, which is a function of the frequency of the portion of the control signal corresponding to the acoustic wave segment.

The number of spatially distinct acoustic wave segments determines the number of corresponding sub-beams.

The dynamically directable source of radiant energy comprises a dynamically configurable beam splitter receiving a beam of radiant energy and splitting the beam into a selectable number of sub-beams. The dynamically configurable beam splitter is capable of changing at least one of the number and direction of the sub-beams within a reconfiguration time duration, and the pulses of radiant energy are separated from each other in time by a time separation which is greater than the reconfiguration time duration.

The plurality of independently positionable beam steering elements is capable of changing the direction of the sub-beams within a redirection time duration, and the pulses of radiant energy are separated from each other in time by a time separation which is less than the redirection time duration.

Each of the beam steering elements includes a reflector mounted on at least one selectably tilting actuator. The actuator comprises a piezoelectric device or a MEMs device.

The number of beam steering devices exceeds the number of sub-beams included in the plurality of sub-beams. At least some of the plurality of sub-beams are directed to at least some of the plurality of beam steering devices while others of the plurality of the beam steering devices are being repositioned.

The selectable number of sub-beams all lie in a plane, a two dimensional array of beam steering elements lies outside the plane, and an array of fixed deflectors optically interposed between the at least one dynamically directable source of radiant energy and the plurality of independently positionable beam steering elements is operative direct the beams lying in a plane to locations outside the plane.

BRIEF DESCRIPTION OF DRAWINGS

The present invention will be understood and appreciated more fully from the following detailed description, taken in conjunction with the drawings in which:

FIGS. 9A and 9B are illustrations showing the result of varying the number of uniform diameter laser beams produced by a dynamic beam splitter in the system and functionality of FIGS. 1A and 2.

DETAILED DESCRIPTION OF PREFERRED EMBODIMENTS

Figure 1:
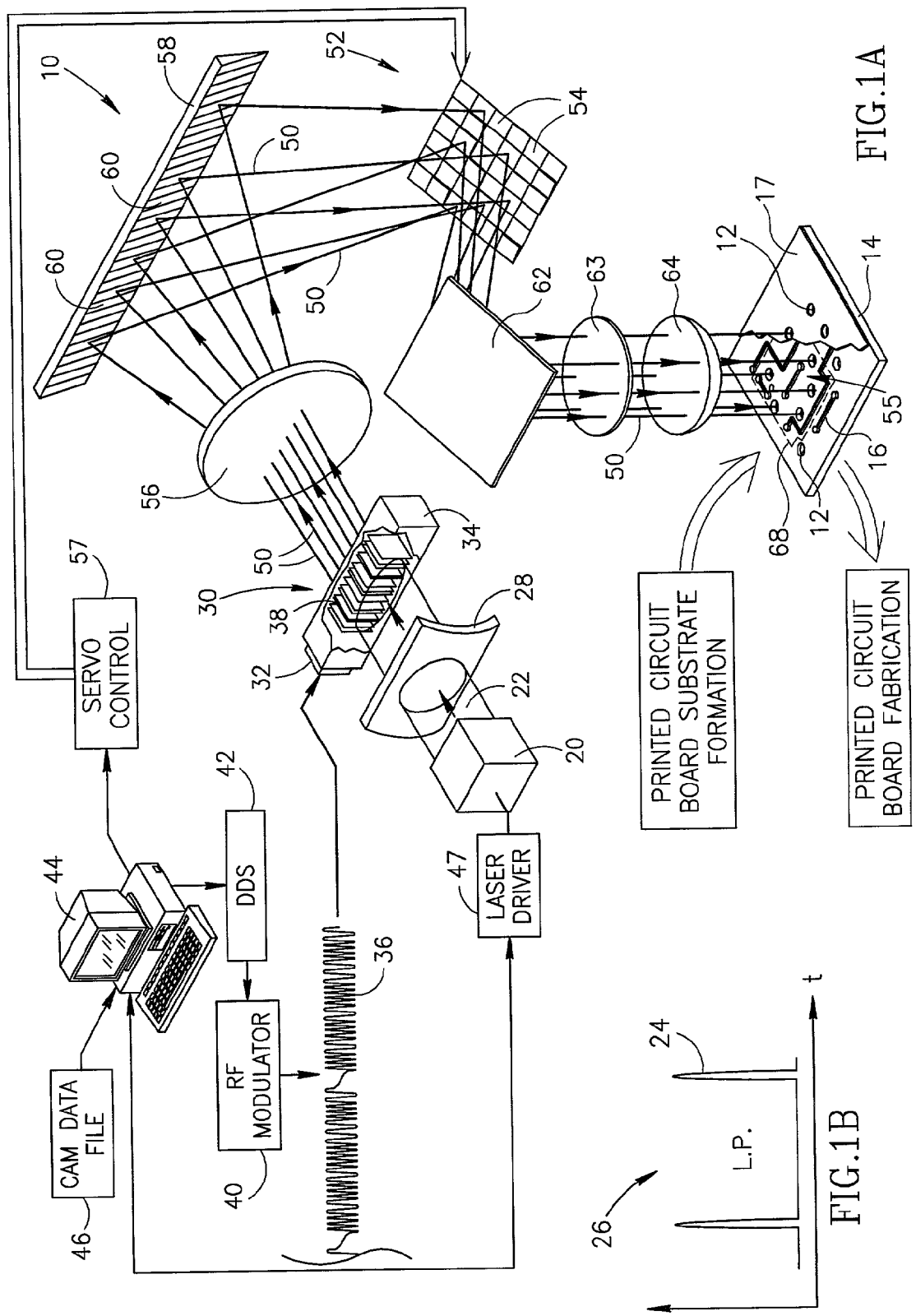
FIG. 1A is a simplified partially pictorial, partially block diagram illustration of a system and functionality for fabricating an electrical circuit constructed and operative in accordance with a preferred embodiment of the present invention.
FIG. 1B is a timing graph of laser pulses output by a laser used in the system and functionality of FIG. 1.

Reference is now made to FIG. 1A, which is a simplified partially pictorial, partially block diagram, illustration of a system and functionality for fabricating an electrical circuit, constructed and operative in accordance with a preferred embodiment of the present invention, and to FIG. 1B which is a timing graph of laser pulses output by a laser used in the system and functionality of FIG. 1A. The system seen in FIG. 1A includes laser micro-machining apparatus 10, which also includes the functionality of delivering energy to a substrate.

Apparatus 10 is particularly useful in the context of micro-machining holes, such as vias 12, in printed circuit board substrates 14, during the fabrication of printed circuit boards. Apparatus 10 may also be used in other suitable fabrication processes employing micro-machining, including without limitation, the selective annealing of amorphous silicon in flat panel displays and the removal of solder masks on electrical circuits. Accordingly, although the invention is described in the context of micro-machining printed circuit boards, the scope of the invention should not be limited solely to this application.

Printed circuit board substrates, such as a substrate 14, which are suitable to be micro-machined using systems and methods described hereinbelow, typically include dielectric substrates, for example epoxy glass, having one or more electrical circuit layers, each electrical circuit layer having selectively formed thereon a conductor pattern 16. The substrates may be formed of a single layer or of a laminate formed of several substrate layers adhered together. Additionally, the outermost layer of the substrate 14 may comprise the conductor pattern 16 formed thereon, as seen in FIG. 1A. Alternatively, the outermost layer of substrate 14 may comprise, for example, a metal foil substantially overlaying a continuous portion of the outer surface of the substrate 14, for example as shown by the region indicated by reference numeral 17.

In an embodiment of the invention, as seen in FIG. 1A, laser micro-machining apparatus 10 includes a pulsed laser 20 outputting a pulsed laser beam 22. Pulsed laser beam 22 is defined by a stream of light pulses, schematically indicated by peaks 24 in laser pulse graph 26 (FIG. 1B). In accordance with an embodiment of the invention pulsed laser 20 is a frequency tripled Q-switched YAG laser providing a pulsed a UV laser beam 22 at a pulse repetition rate of between 10-50 KHz, and preferably at about 10-20 KHz. Suitable Q-switched lasers are presently available, for example, from Spectra Physics, Lightwave Electronics and Coherent, Inc. all of California, U.S.A. Other commercially available pulsed lasers, that suitably interact with typical materials employed to manufacture printed circuit boards, may also be used.

Another laser suitable for use as pulsed laser 20, operative to output a pulsed UV laser beam particularly suitable for micro-machining substrates containing glass, is described in the present Applicants' copending U.S. patent application Ser. No. 10/167,472, filed concurrently herewith and claiming the benefit of U.S. provisional patent application No. 60/362,084, the disclosures of which are incorporated by reference in their entirety.

In the embodiment seen in FIG. 1A, which is a highly simplified schematic representation of laser micro-machining apparatus 10, pulsed laser beam 22 impinges on a first lens 28, which preferably is a cylindrical lens operative to flatten beam 22 at an image plane (not seen) in a first variable deflector assembly, such as an acousto-optical deflector (AOD) 30. Preferably AOD 30 includes a transducer element 32 and a translucent crystal member 34 formed of quartz or other suitable crystalline material.

Transducer 32 receives a control signal 36 and generates an acoustic wave 38 that propagates through crystal member 34 of AOD 30. Control signal 36 preferably is an RF signal provided by an RF modulator 40, preferably driven by a direct digital synthesizer (DDS) 42, or other suitable signal generator, for example a voltage controlled oscillator (VCO). A system controller 44, in operative communication with DDS 42 and a laser driver 47, is provided to coordinate between generation of the control signal 36 and laser pulses 24 defining pulsed laser beam 22 so that portions of substrate 14 are removed, e.g. by ablation, in accordance with a desired design pattern of an electrical circuit to be manufactured. Such design pattern may be provided, for example, by a CAM data file 46 or other suitable computer file representation of an electrical circuit to be manufactured.

As known in the art, the presence of the acoustic wave 38 in crystal member 34, when beam 22 impinges thereon causes beam 22 to be deflected at an angle $\theta_n$ which is a function of the frequency $f_n$ of wave 26 according to the formula:

$$\theta_n = \frac{\Delta f_n \times \lambda}{v_s}$$

Where:

$\Delta f$hd $n = f_n - f_0$;

$\lambda$ = wavelength of beam 22;

$v_s$ = speed of sound in the crystal 34 of AOD 30, and n is an integer representing the index number of a laser sub-beam, as described hereinbelow.

In accordance with an embodiment of the invention, AOD 30 is operative to function as a dynamic beam splitter and which governs at least one of a number segments into which beam 22 is split and its angle of deflection. Signal 36 may be selectably provided so as to cause acoustic wave 38 to propagate at a uniform frequency through crystal member 34. Alternatively, signal 36 may be selectably provided so as to cause the acoustic wave 38 to propagate at different frequencies through the crystal member 34.

Various aspects of the structure, function and operation of AOD 30 as a dynamic beam splitter are described hereinbelow with reference to FIGS. 5-7. The structure and operation of another type of AOD, configured and arranged to function as a dynamic beam splitter and deflector is described in the present Applicants' copending provisional patent application Ser. No. 60/387,911, filed concurrently herewith, entitled: "Dynamic Multi-Pass, Acousto-Optic Beam Splitter and Deflector".

In accordance with an embodiment of the invention, signal 36 causes the acoustic wave 38 to be generated in AOD 30 with different frequencies such that at a moment in time the acoustic wave 38 interacts with the laser pulse 24, the acoustic wave 38 comprises at least two different frequencies. By generating an acoustic wave 38 with more than one frequency, beam 22 is split into more than one segment. Typically, the different frequencies are spatially separated in AOD 30 at the time at which a laser pulse impinges thereon. Alternatively, the different frequencies are superimposed in a complex waveform.

Thus, when the acoustic wave 38 is propagated through crystal member 32 in a non-uniform waveform and interacts with the laser beam 22, the beam 22 is segmented into several beam segments 50, or sub-beams. Each of the segments is deflected at an angle $\theta_n$ which is a function of an acoustic wave frequency, or frequencies, of the acoustic wave 38 in crystal member 34 at the time the laser beam 22, represented by peak 24 (FIG. 1B), impinges thereon.

In accordance with an embodiment of the invention, AOD 30 operates at a duty cycle, which is less than the pulse repetition rate of laser beam 22. In other words, the time required to reconfigure the acoustic wave 38 in AOD 30 to comprise a different composition of frequencies when impinged upon by a laser pulse 24, so as to change at least one of the number of sub-beams 50 and the respective directions thereof at the output from AOD 30, is less than the time separation between sequential pulses 24 in beam 22.

Each one of beam segments 50, whether a single segment provided e.g. by a uniform acoustic wave, or several segments as seen in FIG. 1, is directed towards a second variable deflector assembly 52. The second variable deflector assembly 52 is formed of a plurality of independently tiltable beam steering reflector elements 54.

In accordance with an embodiment of the invention, second variable deflector assembly 52 comprises an optical MEMs device, or is formed as an array of mirrors tiltable by suitable piezo-electric motors, or is formed as an array of galvanometers, or comprises any other suitable array of independently tiltable reflector devices. In the configuration of second variable deflector assembly 52 seen in FIG. 1A, a 6×6 array of reflector elements 54 elements is provided. Any other suitable quantity of independently tiltable reflector elements 54 may be used.

A suitable optical MEMs device providing an array of independently controllable digital light switches is employs technologies used in a Digital Micromirror Device (DMD™) available from Texas Instruments of Dallas, U.S.A. Alternatively, a suitable array of reflector elements 54 may be constructed in accordance with fabrication principles of the DMD™ described in detail in Mignardi et. al., *The Digital Micromirror Device—a Micro-Optical Electromechanical Device for Display Applications*, presented in MEMS and MOEMS Technology and Applications (Rai-Choudhury, editor), SPIE Press, 2000, the disclosures of which are incorporated herein by reference.

Each of the reflector elements 54 is operative to separately and independently steer a beam segment 50 impinging thereon to impinge on the substrate 14 at a selectable location in a target region 55 so as to micro-machine, drill or otherwise remove a portion of substrate 14 at the required location.

As seen in FIG. 1A, operation of reflector elements 54 may be controlled, for example, by a servo controller 57 in operative communication with system controller 44 to ensure that reflector elements 54 suitably direct beam segments 50 to impinge on substrate 14 at a required location, in accordance with a desired design pattern of an electrical circuit to be manufactured. Such design pattern may be provided, for example, by the CAM data file 46 or other suitable computer file representation of an electrical circuit to be manufactured.

Each of the reflector elements 54 is configured so that a beam impinging thereon may be steered to a selectable location in a corresponding region of coverage. In accordance with an embodiment of the invention, the regions of coverage, corresponding to at least some of the reflector elements 54, at least partially mutually overlap.

In accordance with an embodiment of the invention, the number of reflector elements 54 in the second variable deflector assembly 52 exceeds the maximum number of beam segments 50 output by AOD 30. Reflector elements 54 typically operate at a duty cycle which is slower than the pulse repetition rate of laser beam 22. In other words, the time required to redirect a given reflector element 54 so that a beam segment 50 impinging thereon may be redirected to a new location on substrate 14, is greater than the time separation between sequential pulses 24 in beam 22.

Because of the redundancy in reflector elements 54, for any given pulse 24 in beam 22, beam segments 50 are impinging on only some of the reflector elements 54., but not on others. Thus, reflector elements 54, which are not receiving a sub-beam 50, may be repositioned to a new spatial orientation, in preparation for receiving a sub-beam 50 from a subsequent laser pulse 24, while at generally the same time other reflector elements 54 are directing beam segments 50 to impinge on substrate 14.

As seen in FIG. 1A, a folding mirror 62, a focusing lens 63 and a telecentric imaging lens 64 are interposed between second variable deflector assembly 52 and substrate 14 to deliver beam segments 50 to the surface of substrate 14. It is appreciated that the optical design of lenses 63 and 64 should accommodate beam segments 50 which propagate along optical axes extending in mutually different directions.

It is further appreciated that as a function of system geometry and engineering design, a single folding mirror 62, no folding mirror or multiple folding mirrors may be provided. Additionally focusing lens 63 and telecentric lens 64 may be combined into a single optical element, or alternatively each of lenses 62 and 64 may comprise multiple lens elements. Moreover, system 10 may include a zoom lens (not shown) operative to govern a cross sectional dimension of one or more beam segments 50, for example in order to form holes and vias on substrate 14 having different diameters. Alternatively zoom optics may be employed to accommodate and make uniform a diameter of beam-segments 50 which may be output by AOD with different diameters.

In accordance with an embodiment of the invention, the angles $\theta_n$ at which beam segments 50 are deflected by AOD 30 relative to the optical axis of the incoming beam 22 typically are very small, in the order of $10^{-2}$ radians. In order to provide for a more compact system, a beam angle expander, such as a telescoping optical element, schematically represented by lens 56, operative to increase the mutual angular divergence of beam segments 50, preferably is provided downstream of AOD 30.

AOD 30 generally is operative to deflect sub-beams 50 so that the optical axes of beam segments 50 generally lie in a plane. As seen in FIG. 1A, second variable deflector assembly 52 comprises a two dimensional array that lies outside the plane of the optical axes of beam segments 50. As seen in FIG. 1A, a linear to 2-dimensional mapping assembly 58 is located between AOD 30 and the second variable deflector assembly 52. Mapping assembly 58 receives beam segments 50, propagating in the same plane, and redirects the beam segments 50 to a two dimensional array of locations outside the plane of the sub-beams 50.

In accordance with an embodiment of the invention, mapping assembly 58 comprises a plurality of mapped sections 60 each of which are positioned in a suitable spatial orientation so that a beam segment 50 output by AOD 30 which impinges on a given mapped section 60 is directed to a reflector element 54, to which it is mapped.

The following is a simplified general description of the operation and functionality of system 10: The acoustic wave is 38 is generated in crystal 34 in synchronization with the pulses 24 of beam 22 such that a desired acoustic wave structure is present in crystal member 34 at the time a first laser beam pulse impinges thereupon. The acoustic wave 38 may have a uniform frequency throughout crystal 34, which produces a single beam segment 50. Alternatively, acoustic wave may have several different frequencies. Typically, the different frequencies may be, for example, at various spatial segments along the length of acoustic wave 38 to produce several somewhat spaced apart beam segments 50. In accordance with an embodiment of the invention, the duty cycle of AOD 30 is sufficiently fast such that it can be dynamically reconfigured to selectably and differently split or deflect each pulse 24 in a beam 22. In a preferred embodiment of the invention, dynamic reconfiguration of the beam splitter is accomplished by forming acoustic waves having mutually different structures in AOD 30 at the moment each pulse 24 defining beam 22 impinges on AOD 30.

The different frequencies in acoustic wave 38 cause each beam segment 50 to be deflected at a selectable angle $\theta_n$ to impinge on a selected mapped section 60 of mapping assembly 58, preferably after passing through beam expander lens 56. Each beam segment 50 is directed by an appropriate mapped section 60 to a corresponding location on one of reflector elements 54 at second variable deflector assembly 52. The reflector element 54 is suitably tilted so that the beam segment 50 is subsequently further directed to a location on substrate 14 for micro-machining or drilling a required location of the substrate 14.

In accordance with an embodiment of the invention, although AOD 30 operates at a duty cycle which generally is faster than the pulse repetition rate of laser beam 22, the deflection that it provides is relatively limited in that it deflects beam segments 50 by relatively small angles of deflection. The beam segments 50 typically all lie in the same plane.

Conversely, the time required to position individual reflector elements 54 in second variable deflector assembly 52 typically is greater than the time separation between subsequent pulses defining laser beam 22. However, since each reflector element 54 may be tilted over a relatively large range of angles, preferable in at least 2-dimensions, a laser sub-beam 50 impinging on the reflector element 54 may be delivered to cover a relatively large spatial region.

In accordance with an embodiment of the invention, each of reflector elements 54 is suitably tiltable so as that adjacent reflector elements 54 are operable to deliver beam segments 50 to cover mutually overlapping regions on the surface of substrate 14. Moreover, the reflector elements 54 in second variable deflector assembly 52 are able to deliver beam segments 50 to substantially any location in the field of view 68 of the lenses 63 and 64.

After micromachining the desired portions 55 in the field of view 68, substrate 14 and apparatus 10 are mutually displaced relative to system 10 so that the field of view 68 covers a different portion of the substrate 14.

In accordance with an embodiment of the invention, the number of reflector elements 54 in assembly 52 typically exceeds the number of beam segments 50 into which laser beam 22 is split by AOD 30. During an initial time interval, beam segments 50 impinge on a first plurality of the reflector elements 54, but not on other reflector elements 54. The initial time interval is used to reposition the other reflector elements 54 which do not receive a beam segment 50, as described hereinbelow.

During a subsequent second time interval, beam segments 50 are deflected by AOD 30 to impinge on at least some of the reflector elements 54 which did not receive beam segments 50 during the previous time interval. The reflector elements 54 employed in the second time interval are now suitably repositioned to deflect the sub-beam 50 to the substrate 14. During the second time interval at least some of the reflector elements that are not impinged on by a beam segment 50, possibly including reflector elements that were used in the first time interval, are repositioned for use in a subsequent time interval. This process of repositioning reflector elements 54 that are not used during a given time interval is repeated.

Stated generally, it may be said that concurrent to beam segments 50 from a first laser pulse impinging on selected reflector elements 54, other reflectors are concurrently repositioned to receive beam segments 50 from subsequent beam pulses.

Typically the time required to position a single reflector element 54 is in the order of between 1-10 milliseconds, corresponding to about between 20-200 pulses of a 20 KHz Q-switched laser. The length of time, which exceeds the duty cycle of the laser pulses 24, used to position reflectors 54, ensures stabilized beam pointing accuracy. Additionally, the use of multiple reflectors 54 ensures a redundancy which minimizes the loss of pulses while repositioning reflector 54 following micromachining of a location on substrate 14. It is appreciated that in order to the increase the speed of the apparatus 10, and to provide a controlled dosage of energy in each beam segment 50, it may be necessary for more than one beam segment 50 to simultaneously impinge on the surface of substrate 14 at the same location. In such an arrangement, multiple beam segments 50 are each individually deflected to impinge on separate reflectors 54, which are each oriented to direct the sub-beams 50 to impinge on substrate 14 at the same location.

Figure 2:
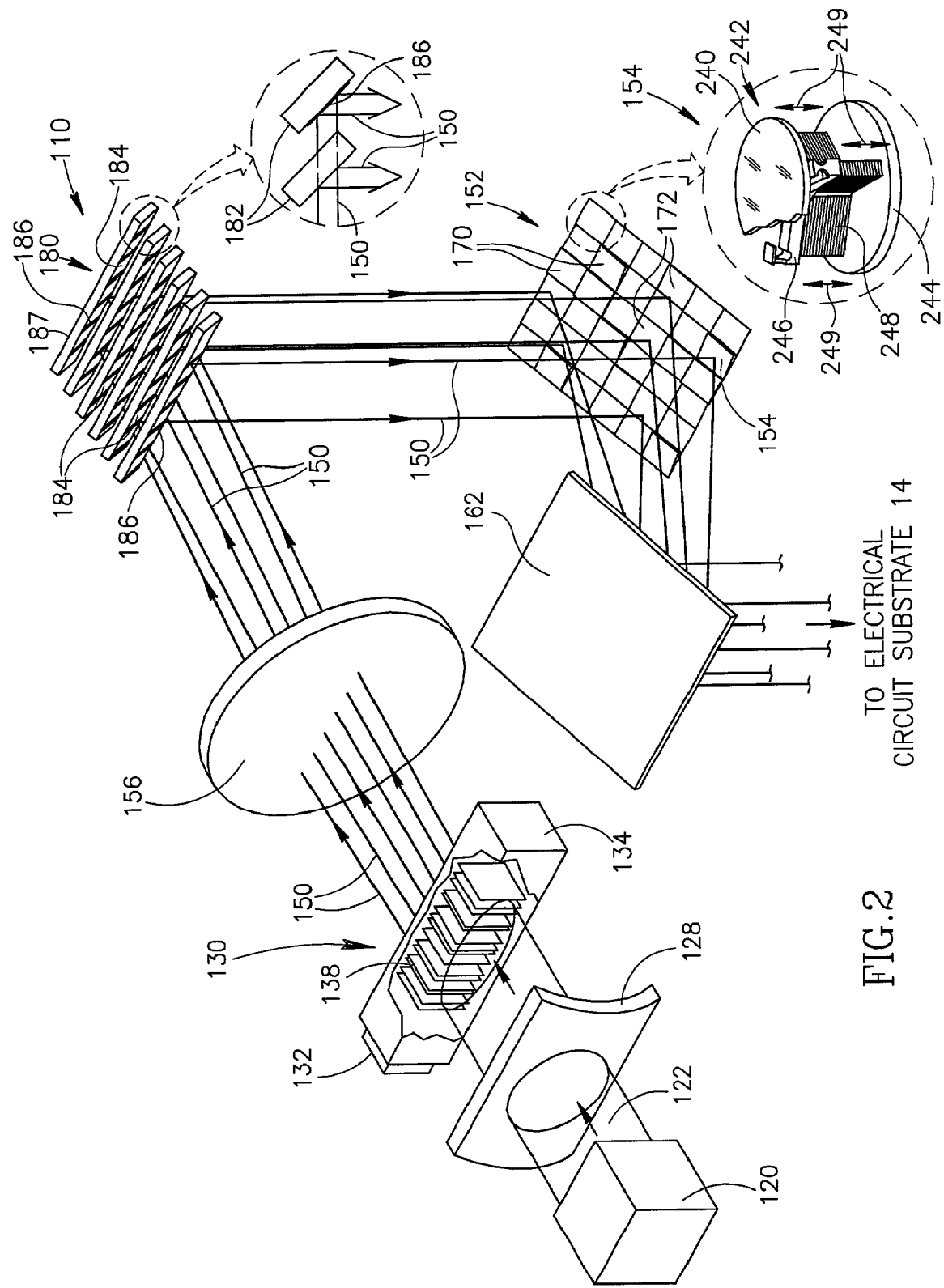
FIG. 2 is a somewhat more detailed partially pictorial, partially block diagram illustration of part of an apparatus for micro-machining electrical substrates in the system and functionality of FIG. 1A.

Reference is now made to FIG. 2 which is a somewhat more detailed partially pictorial, partially block diagram illustration of part of an apparatus 110 for micro-machining electrical circuits in the system and functionality of FIG. 1. In general, laser machining apparatus 110, may be thought of as a system for delivering energy to a substrate.

In an embodiment of the invention, as seen in FIG. 1, laser micro-machining apparatus 110 includes a pulsed laser 120 outputting a pulsed laser beam 122. Pulsed laser beam 122 is defined by a stream of light pulses. In accordance with an embodiment of the invention pulsed laser 20 is a frequency tripled Q-switched YAG laser providing a pulsed a UV light beam 122 at a pulse repetition rate of between 10-50 KHz, and preferably between about 10-20 KHz. Suitable Q-switched lasers are presently available, for example, from Spectra Physics, Lightwave Electronics and Coherent, Inc. all of California, U.S.A. Other commercially available pulsed lasers, that suitably interact with typical materials employed to manufacture printed circuit boards, may also be used.

Another laser suitable for use as pulsed laser 120, operative to output a pulsed UV laser beam particularly suitable for micro-machining substrates containing glass, is described in the present Applicants' copending U.S. patent application Ser. No. 10/167,472, filed concurrently herewith and claiming the benefit of U.S. provisional patent application No. 60/362,084, the disclosures of which are incorporated by reference in their entirety.

In the embodiment seen in FIG. 2, which is a highly simplified schematic representation a preferred embodiment of laser micro-machining apparatus 110, a pulsed laser beam 122 impinges on a first lens 128, which preferably is a cylindrical lens operative to flatten beam 122 at an image plane (not seen) on a first variable deflector assembly, such as an acousto-optical deflector (AOD) 130. Preferably AOD 130 includes a transducer element 132 and a translucent crystal member 134 formed of quartz or any other suitable crystalline material.

Transducer 132 is controlled by a control signal (not shown), corresponding to control signal 36 in FIG. 1A, and is operative to generate acoustic waves 138 that propagate through crystal member 134 of AOD 130, similarly as described with reference to FIG. 1A. The acoustic waves 138 are operative to interact with laser beam 122 in crystal member 134 to dynamically and selectably split and deflect pulses in laser beam 122, to output beam segments 150 or sub-beams 150.

AOD 130 is thus operative to function as a dynamic beam splitter which controls, by forming a suitable acoustic wave 138 having a selectable wave configuration, at least one of a number segments 150 into which beam 122 is split and a direction at which the resulting beam segments are directed.

Various aspects of the structure, function and operation of AOD 130 as a dynamic beam splitter are described hereinbelow with reference to FIGS. 5-7. The structure and operation of another type of AOD configured and arrange to function as a dynamic beam splitter is described in the present Applicants' copending provisional patent application Ser. No. 60/387,911, filed concurrently herewith, entitled: "Dynamic Multi-Pass, Acousto-Optic Beam Splitter and Deflector".

In accordance with an embodiment of the invention, acoustic wave 138 may be formed in AOD 30 with several different frequencies such that at a moment in time at which the acoustic wave 138 interacts with the laser beam 122, the acoustic wave 138 comprises at least two different frequencies. By forming an acoustic wave 138 with more than one frequency, beam 122 is split into more than one segments 150. The different frequencies may be spatially separated in AOD 130 at the time at which a laser pulse impinges thereupon. Alternatively, the different frequencies may be superimposed in a complex waveform.

Thus when acoustic wave 138 is propagated through crystal member 132 in a non-uniform waveform, beam 122 may be segmented into several beam segments 150, or sub-beams. Each of the beam segments 150 is deflected at an angle $\theta_n$ which is a function of an acoustic wave frequency, or frequencies, of acoustic wave 138 in crystal member 134 at the time a laser pulse in laser beam 122 impinges thereon.

In accordance with an embodiment of the invention, AOD 30 operates at a duty cycle which is shorter than the pulse repetition rate of laser beam 122. Thus, the time required to reconfigure an acoustic wave 138 in AOD 130 to comprise a different composition of frequencies when interacting with a laser pulse in laser beam 122, so as to change at least one of the number and respective directions of sub-beams 150, is less than the time separation between sequential pulses in laser beam 122.

Each one of beam segments 150, whether a single segment provided e.g. by a uniform acoustic wave, or several segments as seen in FIG. 2, is directed to a first selectable target located at a second variable deflector assembly 152. The second variable deflector assembly 152 is formed of a plurality of independently tiltable beam steering reflector elements 154.

Each of the reflector elements 154 also operates to further separately and independently steer a beam segment 150, impinging thereon, to impinge on substrate 14, as described with reference to FIG. 1A, and subsequently to micro-machine, drill or otherwise remove a portion of substrate 14 at such location.

In accordance with an embodiment of the invention, each reflector element 154 comprises a mirror 240, or another suitable reflective element, mounted on a positioner assembly 242 comprising a base 244, a mirror support 246, at least one selectable actuator 248, 3 actuators are shown assembled in a starlike arrangement, and a biasing spring (not shown). Each of the selectable actuators 248 is, for example, a piezoelectric actuator, such as a TORQUE-BLOCK™ actuator available from Marco Systemanalyse und Entwicklung GmbH of Germany, independently providing an up and down positioning as indicated by arrows 249 so as to selectively tilt mirror 240 into a desired spatial orientation for receiving a beam segment 150 and subsequently to direct the beam segment 150 to impinge on a desired location on the surface of substrate 14.

As appreciated from FIG. 2, considered along with FIG. 1A, each of the actuators 248 is operatively connected to a servo controller 57 which in turn is operatively connected to and controlled by system controller 44 as described hereinabove with respect to FIG. 1A. Thus, it is appreciated that in correspondence to the a pattern design, for example of a pattern of vias in an printed circuit board, contained in CAM data file 46, the relative spatial orientation, or tilt, of reflector elements 154 is independently controlled in synchronization with the laser pulses defining beam 122 and with the generation of control signal controlling the operation of AOD 130 to dynamically split and deflect laser beam 122. A beam segment 150 is deflected to a desired reflector element 154, which in turn is suitably oriented so that the beam segment 150 ultimately impinges on substrate 14 at a desired location.

In accordance with an embodiment of the invention, each of the reflector elements 154 is configured so that a sub-beam 150 may be steered to a selectable location in a corresponding region of coverage on substrate 14. The regions of coverage corresponding to at least some of the reflector elements 154 at least partially mutually overlap.

The number of reflector elements 154 in second variable deflector assembly 152 typically exceeds the maximum number of beam segments 150 output by AOD 130. Thus as seen in FIG. 2, second variable deflector assembly includes 36 reflector elements, while 6 sub-beams 150 are output by AOD 130. Reflector elements 154 typically operate at a duty cycle which is less than the pulse repetition rate of laser beam 122. Thus, the time required to mechanically reposition a reflector element 154, so that a beam segment 150 impinging thereupon may be redirected to a new location on substrate 14 is greater than the time separation between sequential pulses defining beam 122.

Because of the redundancy in reflector elements 154 over the respective of beam segments 150, for any given pulse in beam 122, beam segments 150 are deflected to impinge on some reflector elements 154, but not on other reflective elements 154. Thus, some reflector elements 170 which are not receiving a beam segment 150 may be repositioned to a new spatial orientation, in preparation for receiving a subsequent laser pulse 24, while at the same time other reflector elements 172, which are receiving a beam segment 150, are directing the beam segments 150 to impinge downstream, on substrate 14.

In accordance with an embodiment of the invention, the angles $\theta_n$ at which beam segments 150 are deflected by AOD 130 relative to the optical axis of the incoming beam 122 typically are very small, in the order of $10^{-2}$ radians. In order to provide for a more compact system, a beam angle expander, such as a telescoping optical element, schematically represented by lens 156, operates to increase the mutual angular divergence of beam segments 150, preferably is provided downstream of AOD 130.

AOD 130 generally is operative to deflect beams 50 so that the optical axes of beam segments 150 generally lie in the same plane, while second variable deflector assembly 152, comprising a two dimensional array that lies outside the plane of the optical axes of beam segments 150.

A 2-dimensional mapping assembly 180 is interposed between AOD 130 and the second variable deflector assembly 152. Mapping assembly 180 receives beam segments 150, all generally propagating in a plane, and redirects the beam segments 150 to a two dimensional array of locations outside the plane of the sub-beams 150.

In accordance with an embodiment of the invention, mapping assembly 180 comprises an array of support members 182 which comprise a plurality of optically transmissive portions 184, through which beam segments 150 can pass, and a plurality of reflective portions 186 operative to reflect beam segments 150, which impinge thereupon.

As seen in FIG. 2, the reflective portions 186 generally are spaced apart on each support member 182, and the respective locations of reflective portions 186 are preferably mutually laterally staggered among support members 182. Each reflective portion 186 is generally mapped to a corresponding reflector element 154. Consequently, each beam segment 150 entering assembly 180 is received by the respective reflective portion 186 on a first support member 187, or passes through one or more support members until it is received by a reflective portion 186 on one of the other support members 182.

Assembly 180 thus provides a means for redirecting beam segments 150, which propagate along optical axes lying in a plane of beam propagation, to impinge on a two dimensional array of locations lying outside the plane of propagation. AOD 130 selectively deflects a beam segment 150 to impinge on one of the reflective portions 186 formed on one of the support members 182 in assembly 180. Because reflective portions 186 intersect the plane of propagation at mutually staggered locations, along both an X axis and a Y axis in the plane of propagation, the angle at which a beam segment 150 is selectably deflected by AOD 130 determines the reflective portion 186 on which it impinges. Thus, a location in a two dimensional array of selectable locations, such as at second variable deflector assembly 152, lies outside the plane of propagation.

Figure 3:
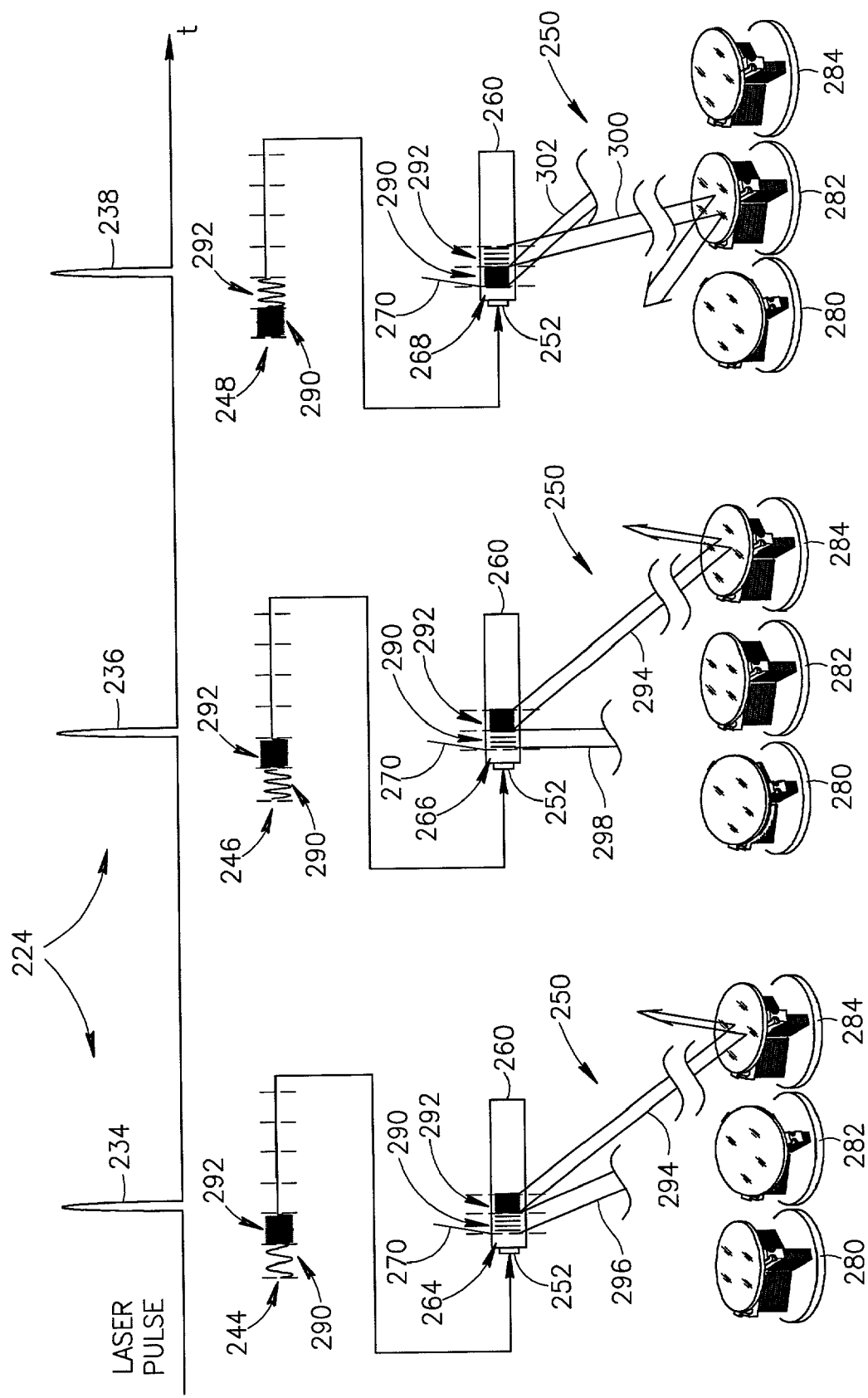
FIG. 3 is a somewhat more detailed partially pictorial, partially block diagram illustration of an aspect of operation of part of the system and functionality of FIG. 2.

Reference is now made to FIG. 3 which is a somewhat more detailed partially pictorial, partially block diagram illustration of an aspect of operation of part of the system and functionality of FIG. 2. Laser pulses 224 in a laser pulse timing graph 226 are designated 234, 236 and 238 respectively. Laser 122 typically comprises laser pulses 224 which are spaced time. Control signals 244, 246 and 248 are shown below laser pulses 234, 236 and 238 respectively. The control signals 244-248, for controlling the generation of the pulse 138 are shown being fed into a transducer 252 associated with an AOD 260. AOD 260 typically corresponds to AOD 130 in FIG. 2. Acoustic wave, corresponding to control signals 264-268 are shown in AOD 260. Acoustic wave 264 corresponds to control signal 244, acoustic wave 266 corresponds to control signal 246 and acoustic wave 268 corresponds to control signal 244. For the purposes of simplicity of illustration, only a part of AOD 260 is shown for each of laser pulses 224.

At a moment in time, corresponding to the emission of a laser pulse 224, an input laser beam 270 impinges on the AOD 260. The acoustic waves 264-268 respectively cause laser beam 270 to be segmented into beam segments, generally designated 250, each of which is deflected at an angle of deflection which is functionally related to corresponding frequencies in acoustic waves 264-268.

First, second and third reflector elements, 280, 282 and 284 respectively, corresponding to beam steering reflector elements 154 in FIG. 2, are shown below each of the AODs 260. At a time corresponding to each laser pulse 224, a beam segment 250 is deflected to impinge on one of the reflector elements 280, 282 and 284.

FIG. 3 also shows with particularity the timing relationship between laser pulses 224, operation of AOD 260 as a dynamic beam deflector having a duty cycle which is faster than the pulse repetition rate represented by pulses 224, and operation of reflector elements 280, 282 and 284, having a duty cycle which is slower than the pulse repetition rate As previously noted, the reconfiguration time required to introduce a different acoustic wave into AOD 260 is less than the time separation between pulses 234. Thus, the respective waveforms of control signals 244-248, and the respective waveforms of acoustic waves 264-268 are each different thereby resulting in the selectable deflection of beam segments 250 for each of pulses 224. It is noted however, that in the sequentially provided control signals 244 and 246, and corresponding sequentially provided acoustic waves 264 and 266, the frequency in a first spatial wave segment 290 changes, while the frequency in a second spatial wave segment 292 remains unchanged.

For both pulses 234 and 236, a first beam segment 294, corresponding to the second spatial wave segment 292, impinges on third reflector element 284. Reflector element 284 is held stationary to receive the first beam segment 294 for each of pulses 234 and 236 respectively.

A second beam segment 296 is deflected in a first direction by first spatial segment 290 of acoustic wave 264, while a third beam segment 298 is deflected in a different direction by first spatial segment 290 in acoustic wave 266.

Moreover, for pulses 234 and 236, neither of the beam segments 250 impinge on first and second deflector elements 280 and 282 respectively, but rather are directed to other deflector elements which are not shown. The time interval between pulses 234 and 236 is utilized to spatially reposition the first and second reflector elements 280 and 282.

A new wave form of acoustic wave 268 is formed in AOD 260 to selectably split and deflect beam 270 at pulse 238. As seen below pulse 238, none of the beam segments 250 impinge on first reflector element 280 or third reflector element 284.

A fourth beam segment 300 impinges on deflector element 282. Beam segment 300 is deflected in a direction that is functionally related to the frequency of acoustic wave 268 in second spatial segment 292. It is noted that the frequency in the second spatial segment 292 of acoustic wave 268 has been changed relative to the acoustic waves 264 and 266. A fifth beam segment 302 is deflected in a direction that is functionally related to the frequency of acoustic wave 268 in first spatial segment 290.

It is thus noted from the foregoing that the repositioning time of reflector elements 280-284, such as beam steering reflector elements 154, is slower than a time separation between pulses 224. Nevertheless, because the reconfiguration time of dynamic beam splitter is less than the time separation between pulses, any redundant reflector elements can be repositioned over a time interval greater than the separation between pulses. A reflector element that is in a suitable position can then be selected in a time interval that is less than the time separation between pulses.

Figure 4:
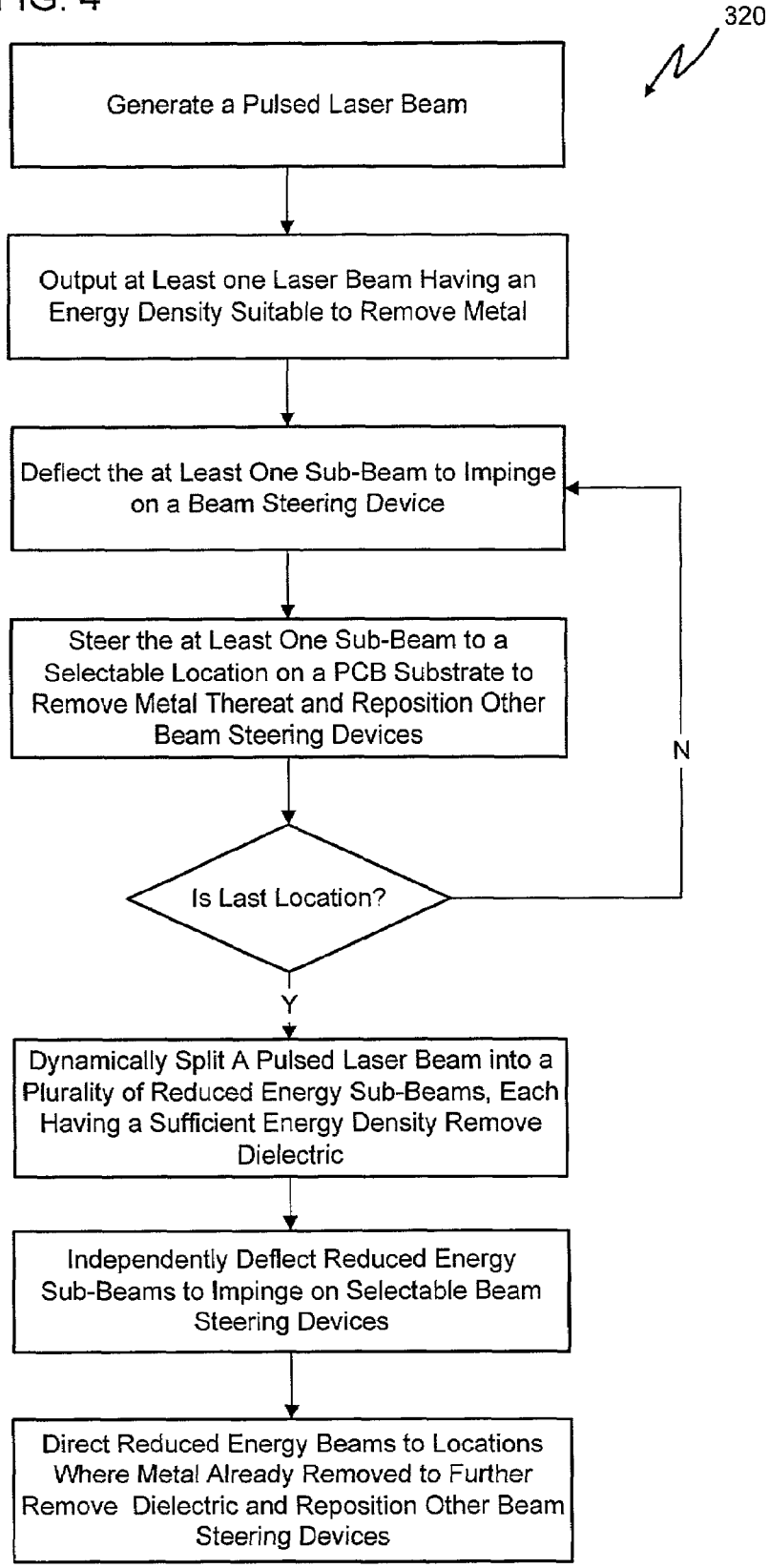
FIG. 4 is a flow diagram of a method for manufacturing electrical circuits in accordance with an embodiment of the invention.

Reference is now made to FIG. 4 which is a flow diagram 320 of a methodology for manufacturing electrical circuits in accordance with an embodiment of the invention. The methodology is described in the context of a process for forming micro vias in a multi layered printed circuit board substrate having a metal foil layer overlaying a dielectric substrate.

The presently described methodology for manufacturing electrical circuits employs at least one dynamically directable source of radiant energy providing a plurality of beams of radiation, each beam propagating in a dynamically selectable direction. The beams are selectably directed to a plurality of independently positionable beam steering elements. Some of the beam steering elements receive the beams and direct them to selectable locations on a printed circuit board substrate to be micro-machined.

Suitable apparatus for generating a plurality of beams propagating in dynamically selectable directions is the laser micro-machining apparatus 10 is described with reference to FIG. 1A, and laser micro-machining apparatus 110 described with reference to FIG. 2. Thus beams propagating in dynamically selectable directions may be produced, for example, by passing one or more beams output by at least one Q-switched laser through at least one dynamic beam splitting and deflecting device. Optionally, several separately generated beams may be treated separately or in combination.

In accordance with an embodiment of the invention, the dynamic deflector device is operable to selectably provide at least one metal machining beam-segment. In an embodiment of the invention, a beam splitting functionality is provided by the dynamic deflector, although a separate beam splitting device providing a selectable beam splitting function may be provided. The metal-machining beam-segment has an energy density that is suitable to remove a portion of the metal foil layer, for example by burning or by ablation.

Each metal machining beam segment is dynamically deflected to impinge on a beam steering device, such as a tiltable reflector element 154 in FIG. 2. The beam steering device is suitably positioned so that the metal machining beam segment is steered to a selectable location on a PCB substrate whereat a portion of the metal foil is removed to expose the underlying dielectric substrate.

While a metal machining beam is removing a portion of the metal foil at a first location, beam steering devices which are not being presently used may be suitably repositioned for removal of metal foil at other selectable locations. Thus, each subsequent pulse may be deflected by the dynamic beam deflector to impinge on an already positioned beam steering device.

Removal of portions of the metal foil continues at selectable locations until metal foil is removed for a desired plurality of locations.

In a subsequent operation, the dynamic deflector device is provide at least one dielectric machining beam-segment having an energy property that is different from the metal machining beam-segment. A beam splitting functionality may be provided, for example by the dynamic deflector or by a suitable beam splitter device. For example, dielectric machining beam segment has a lower energy density than a metal machining beam-segment. The energy property of the dielectric machining beam segment is suitable to remove a portion of the dielectric layer, for example by burning or by ablation, but is not suitable to remove a portion of the metal foil.

In accordance with an embodiment of the invention, the respective energy densities of beam segments 50 and 150 are controlled by splitting laser beam 22 and 122 into a selectable number of beam segments 50 and 150, and by maintaining the diameter of the resulting beam segment 150 irrespective of the number of beam segments.

Each dielectric machining beam segment is dynamically deflected to impinge on a beam steering device, such as a tiltable reflector element 154 in FIG. 2. The beam steering device is suitably positioned so that each dielectric machining beam segment is steered to a selectable location whereat a portion of the metal foil has already been removed, to expose of the dielectric layer, and a desired portion of the dielectric is removed.

While a dielectric machining beam is removing a portion of the dielectric at a first set of locations, beam steering devices which are not being presently used may be suitably repositioned for removal of dielectric at other selectable locations. Thus, each subsequent pulse may be deflected by the dynamic beam deflector to impinge on an already positioned beam steering device. It is appreciated that because a reduced energy density is required to remove dielectric, beam 122 may be divided into a greater number of dielectric machining beam segments, resulting in a greater system throughput for removing dielectric as compared to removing metal foil.

Removal of dielectric continues at selectable locations until the dielectric is removed for substantially all of the locations at which metal foil was previously removed. Once this operation is completed, a substrate can be repositioned for micro-machining of a subsequent portion thereof.

As noted above, in accordance with an embodiment of the present invention, an AOD is configured and operative to dynamically and selectably split an incoming beam of radiation into a selectable number of beam segments, each of which is dynamically directed in a selectable direction.

Figure 5:
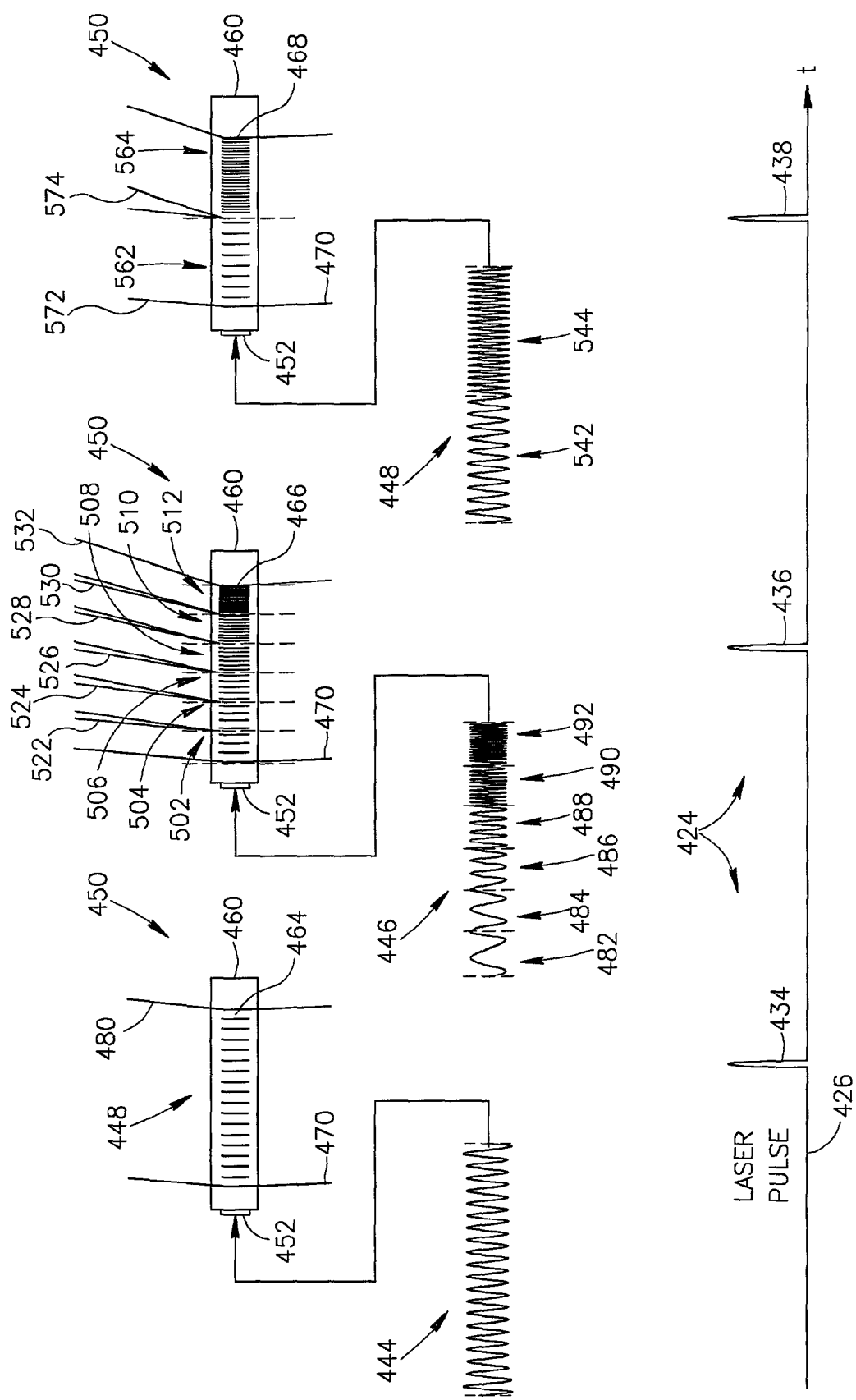
FIG. 5 is an illustration showing the result of varying the number and angle of laser beams produced by a dynamic beam splitter in the system and functionality of FIGS. 1A and 2.

Reference is now made to FIG. 5, which is an illustration of varying the number and angle of laser beams produced by a dynamic beam splitter in the system and functionality of FIGS. 1 and 2. Laser pulses 424 in a laser pulse timing graph 426 are designated 434, 436 and 438 respectively. Laser pulses 424 define, for example, beam 122 in FIG. 2 and are mutually separated in time.

Control signals 444, 446 and 448 are shown above laser pulse timing graph 426, corresponding to pulses 434, 436 and 438 respectively. The control signals 444-448 are shown being fed into a transducer 452 associated with an AOD 460, corresponding to AOD 130 in FIG. 2. Acoustic waves, 464, 466 and 468, corresponding to control signals 444-448 are shown in AOD 460. Acoustic wave 464 corresponds to control signal 444, acoustic wave 466 corresponds to control signal 446 and acoustic wave 468 corresponds to control signal 448.

At a moment in time corresponding to the emission of a laser pulse 424, an input laser beam 470 impinges on the on AOD 460. The acoustic waves 464-468 respectively cause laser beam 470 to be segmented into a selectable number of beam segments, generally designated 450. Each of the beam segments 450 is deflected at an angle of deflection which is functionally related to a corresponding frequency in a portion of acoustic waves 464-468.

FIG. 5 shows with particularity the timing relationship between laser pulses 424 and operation of AOD 460 as a dynamic beam splitter which is operative to split an input beam 470 into a selectable number of beam segments 450 at a duty cycle which is less than the pulse repetition rate represented by pulses 424.

A control signal 444 having a generally uniform frequency generates an acoustic wave 464 in AOD 460 also having a generally uniform frequency. When the beam 470 associated with pulse 434 impinges on AOD 460, a single beam-segment 480 is output. It is noted that a part of beam 470 may not be deflected. This is ignored for the purposes of simplicity of illustration.

A control signal 446 having a six spatially distinct segments 482-492, each segment having a generally uniform frequency and a frequency which is different from a neighboring segment, generates an acoustic wave 466 in AOD 460 also having six spatially distinct segments 502, 504, 506, 508, 510 and 512. Each of the spatially distinct segments 502-512 respectively has a generally uniform acoustic frequency and an acoustic frequency which is different from a neighboring segment. When the beam 470 associated with pulse 436 impinges on AOD 460, six distinct beam-segments 522-532 are output. It is noted that a part of beam 470 may not be deflected. This is ignored for the purposes of simplicity of illustration.

A control signal 448 having a two spatially distinct segments 542 and 544, each segment having a generally uniform frequency and a frequency which is different from its neighboring segment, generates an acoustic wave 468 in AOD 460 also having two spatially distinct segments 562 and 564. Each of the spatially distinct segments 562 and 564 respectively has a generally uniform acoustic frequency and an acoustic frequency which is different from its neighboring segment. When the beam 470 associated with pulse 438 impinges on AOD 460, two distinct beam-segments 572 and 574 are output. It is noted that a part of beam 470 may not be deflected. This is ignored for the purposes of simplicity of illustration.

In the embodiment seen in FIG. 5, the division of a beam 470 into different numbers of beam-segments 450 results in beam segments 450 each having different a different width. In such embodiment it may be desirable to provide suitable optics downstream of AOD 460 in order to control the size of a spot impinging on a substrate 14, resulting from each different number of beam-segments 450, for example to ensure a uniform diameter.

Figure 6:
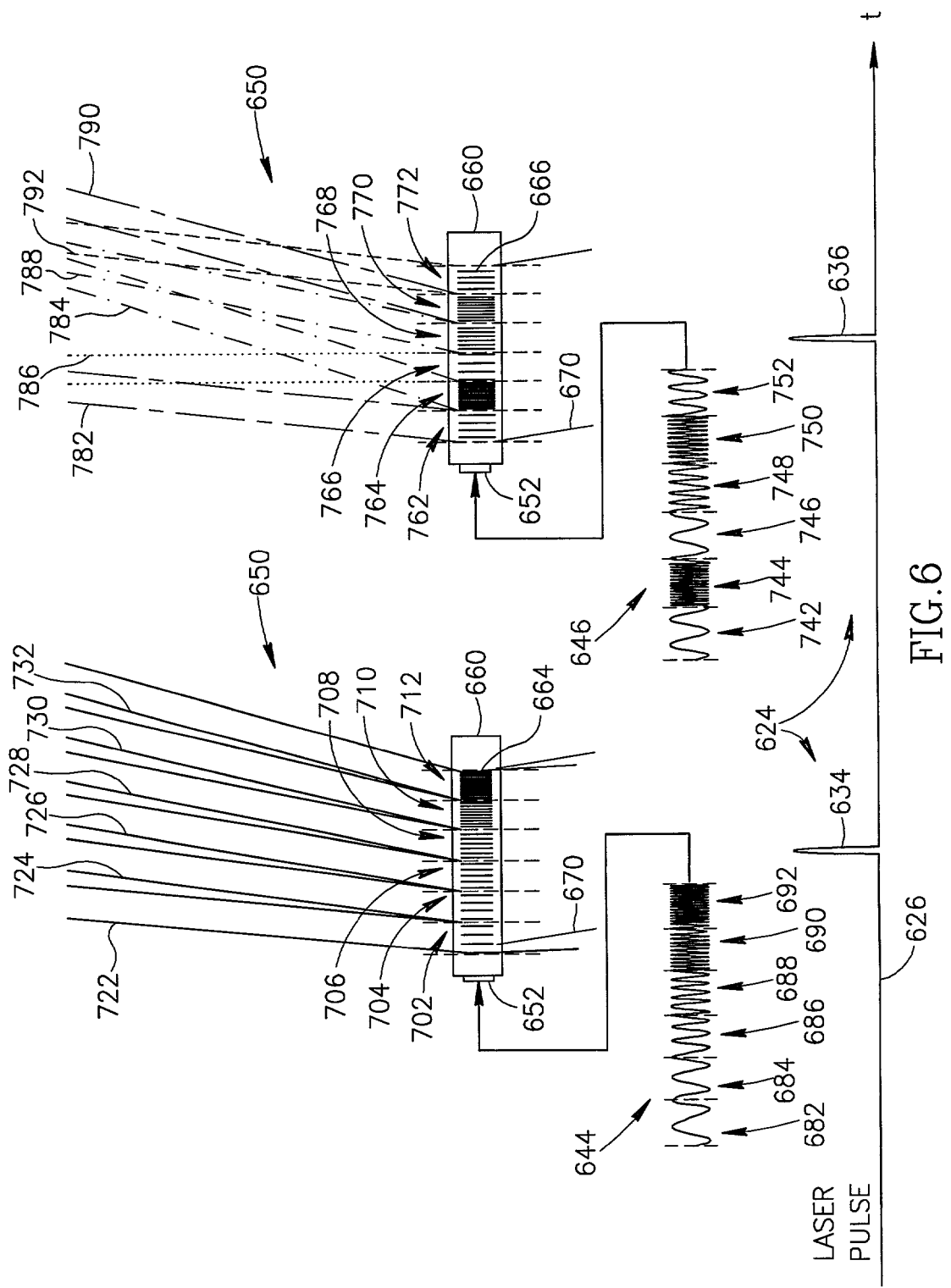
FIG. 6 is an illustration showing the result of varying the angle of multiple laser beams produced by a dynamic beam splitter in the system and functionality of FIGS. 1A and 2.

Reference is now made to FIG. 6, which is an illustration of varying the angle of multiple laser beams produced by a dynamic beam deflector in the system and functionality of FIGS. 1A and 2. Laser pulses 624 in a laser pulse timing graph 626 are designated 634 and 636 respectively. Laser pulses 624 define, for example, beam 22 in FIG. 1 and beam 122 in FIG. 2, and are mutually separated in time.

Control signals 644 and 646 are shown above laser pulse timing graph 626, corresponding to pulses 634 and 636 respectively. The control signals 644 and 646 are shown being fed into a transducer 652 associated with an AOD 660, corresponding to AOD 30 in FIG. 1 and AOD 130 in FIG. 2. Acoustic waves, corresponding to control signals 644 and 646 are shown in AOD 660. Acoustic wave 664 corresponds to control signal 644, and acoustic wave 666 corresponds to control signal 646.

At a moment in time corresponding to the emission of a laser pulse 624, an input laser beam 670 impinges on the on AOD 660. The acoustic waves 664 and 666 respectively cause laser beam 670 to be segmented into a selectable number of beam segments, generally designated 650, as described with reference to FIG. 5. Each of the beam segments 650 is deflected at an angle of deflection which is functionally related to a corresponding frequency in a portion of acoustic waves 664-666.

FIG. 6 shows with particularity the timing relationship between laser pulses 634 and operation of AOD 660 as a dynamic beam splitter which is operative to split the input beam 670 into a selectable number of beam segments 650, and to separately deflect the beam segments 650 at distinct angles of deflection, all at a duty cycle which is less than the pulse repetition rate represented by pulses 624.

A control signal 644 having a six spatially distinct segments 682-692, each segment having a generally uniform frequency and a frequency which is different from a neighboring segment, generates an acoustic wave 664 in AOD 660 also having six spatially distinct segments 702, 704, 706, 708, 710 and 712. Each of the spatially distinct segments 702-712 respectively has a generally uniform acoustic frequency and an acoustic frequency which is different from a neighboring segment. When the beam 670 associated with pulse 634 impinges on AOD 660, six distinct beam-segments 722-732 are output. It is noted that the respective frequencies in each of segments 702-712 progressively increases, relative to the previous segment, and as a result the angle at which beams 722-732 are deflected increases in a corresponding manner.

A control signal 646 having a six spatially distinct segments 742-752, each segment having a generally uniform frequency and a frequency which is different from a neighboring segment, generates an acoustic wave 666 in AOD 660 also having six spatially distinct segments 762, 764, 766, 768, 770, and 772 respectively. Each of the spatially distinct segments 762-772 respectively has a generally uniform acoustic frequency and an acoustic frequency which is different from a neighboring segment. When the beam 670 associated with pulse 636 impinges on AOD 660, six distinct beam-segments 782-790 are output, in which beam-segment 782 corresponds to acoustic wave segment 762, beam-segment 784 corresponds to acoustic wave segment 764, beam-segment 786 corresponds to acoustic wave segment 766, beam-segment 788 corresponds to acoustic wave segment 768, beam-segment 790 corresponds to acoustic wave segment 770, and beam-segment 792 corresponds to acoustic wave segment 792.

It is seen that the arrangement of respective frequencies in each of acoustic wave segments 762-772 does not change in an orderly manner. As a result some of beams 782-790 overlap. This enables beams 782-790 to be selectably deflected to impinge, for example on a mapping element 60 (FIG. 1). It is further noted that the change in angles occurring in beams 782-792, relative to beams 722-732 results from the reconfiguration of the acoustic wave in AOD 660. Accordingly, the change in configuration of the acoustic wave, from acoustic wave 664 to acoustic wave 666, is carried out in a period of time that is less than the time separation between pulses 634 and 636.

Figure 7:
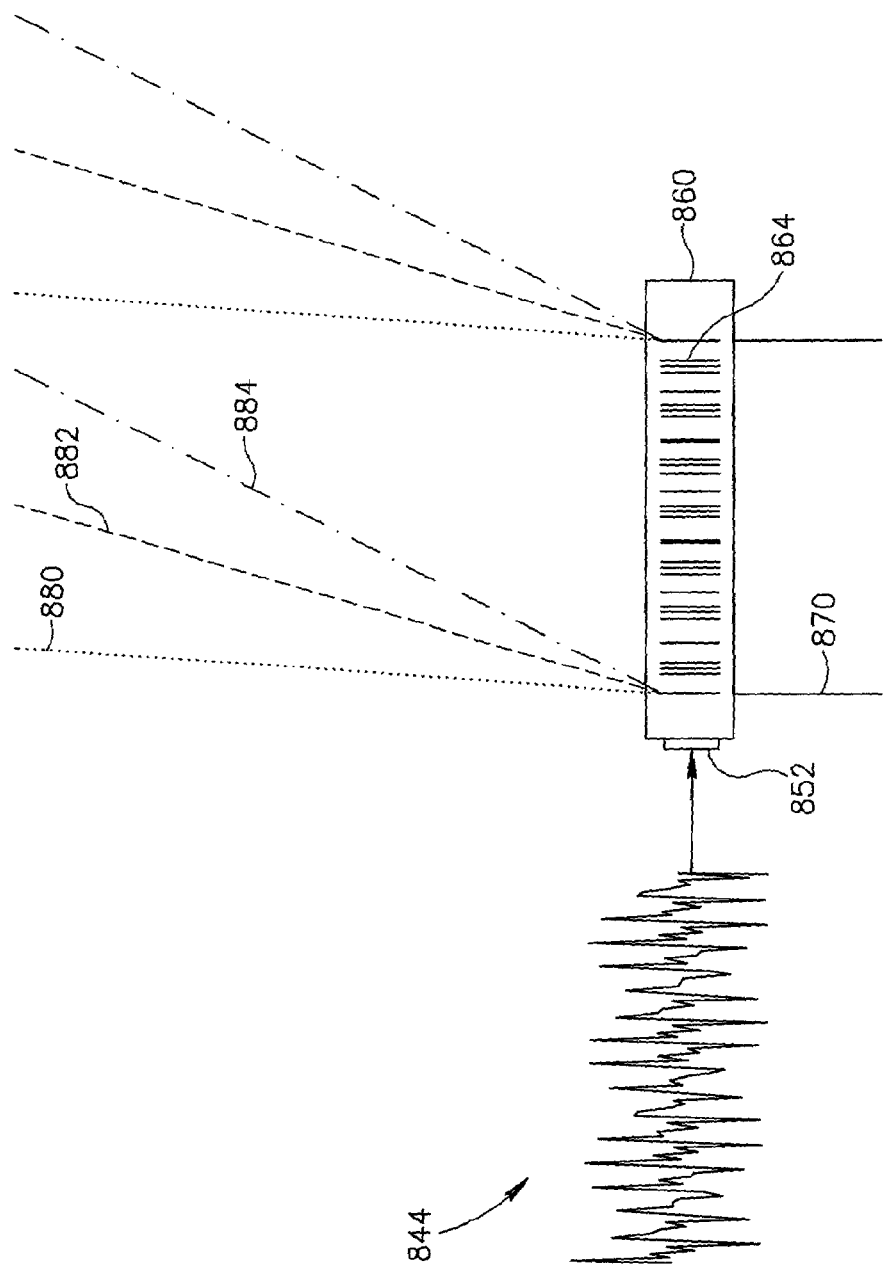
FIG. 7 is an illustration showing the result of varying the angles of multiple at least partially superimposed laser beams produced by a dynamic beam splitter produced by modulation control signals including multiple at least partially superimposed different frequency components in the system and functionality of FIGS. 1A and 2.

Reference is now made to FIG. 7 which is an illustration of varying the angles of multiple at least partially superimposed laser beams produced by a dynamic beam splitter, by modulating, for example control signals 36, including multiple at least partially superimposed different frequency components, in the system and functionality of FIGS. 1A and 2. A control signal 844 is shown being fed into a transducer 852 associated with an AOD 860, corresponding to AOD 30 in FIG. 1 and AOD 130 in FIG. 2. An acoustic wave 864, corresponding to control signal 844 is shown in AOD 860.

Control signal 844 corresponds to a mutual superimposition of three control signals (not shown) each having a different frequency. It is noted that a greater or lesser number of control signals may be superimposed, and that superimposition of three control signals is chosen merely for the purposes of simplicity of illustration.

At a moment in time corresponding to the emission of a laser pulse in a pulsed laser beam 22 or 122, an input laser beam 870 impinges on the on AOD 860 and is split into three beam segments 880, 882 and 884. Each of the beam segments 880-884 has a generally uniform width generally related to the width of acoustic wave 864 in AOD 860. Each of the beam segments 880, 882 and 884 is deflected at an angle functionally related to one of the frequency components is acoustic wave 864, and at least partially mutually overlap.

Figure 8:
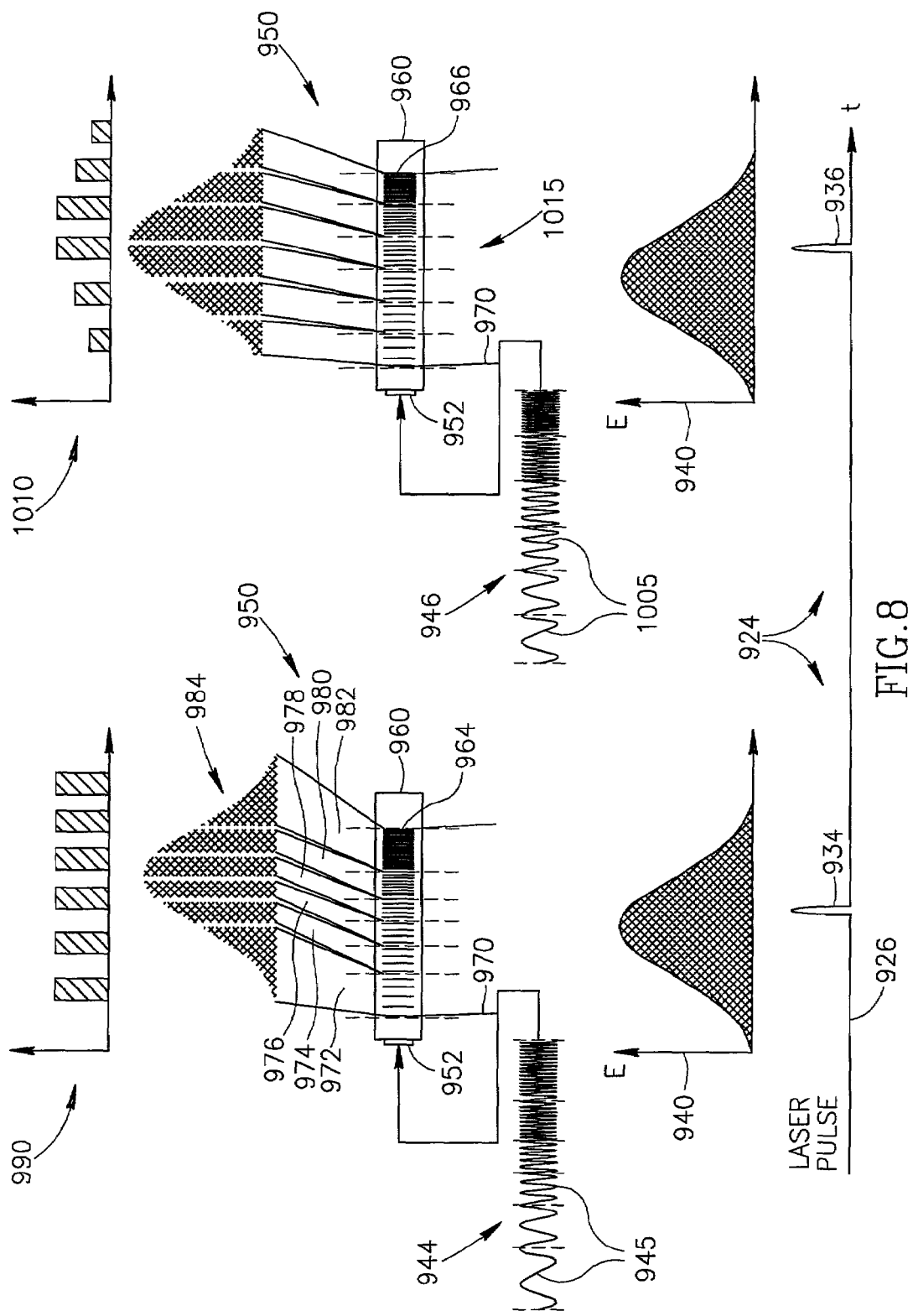
FIG. 8 is an illustration showing the result of varying the energy distribution among multiple laser beams produced by a dynamic beam splitter in the system and functionality of FIGS. 1A and 2.

Reference is now made to FIG. 8 which is an illustration of varying the energy distribution among multiple laser beam segments produced by a dynamic beam splitter in the system and functionality of FIGS. 1A and 2. Typically, due to the Gaussian energy profile of typical laser beams, a uniform spatial splitting of the beam results in beam segments, such as beam segments 150 in FIG. 2, which do not have a uniform energy property. It is appreciated, that a beam shaping element, located upstream of the dynamic beam splitter, may be provided to form a beam, such as beam 22 or 122, which has a non-Gaussian, preferably top-hat shaped energy profile. In accordance with an embodiment of the invention, presently described, sub-beams having a generally uniform energy characteristic that is formed without using an external beam shaping element. Additionally, an energy characteristic of the sub beams may be changed in a time which is less than a separation time between pulses in a pulsed laser.

In FIG. 8, laser pulses 924 in a laser pulse timing graph 926 are designated 934 and 936 respectively. Laser pulses 924 define, for example, beam 122 in FIG. 2 and are mutually separated in time. An input energy graph 940 indicates a typical Gaussian energy characteristic, in one dimension, of a laser beam such as beam 122.

Control signals 944 and 946 are shown above laser pulse timing graph 926, and correspond to pulses 934 and 936 respectively. The control signals 944 and 946 are shown being fed into a transducer 952 associated with an AOD 960, corresponding to AOD 30 in FIG. 1 and AOD 130 in FIG. 2. Acoustic waves, corresponding to control signals 944 and 946 are shown in AOD 960. Acoustic wave 964 corresponds to control signal 944 and acoustic wave 966 corresponds to control signal 946.

At a moment in time corresponding to the emission of a laser pulse 924, an input laser beam 970 impinges on the AOD 960. The acoustic waves 964 and 966 respectively cause laser beam 970 to be segmented into a selectable number of beam segments, generally designated 950. Each of the beam segments 950 is deflected at an angle of deflection which is functionally related to a corresponding distinct frequency in a portion of acoustic waves 964 and 966, and the width of beam segments is related to the width of a portion of acoustic waves 964 and 966 which has a distinct frequency.

It is seen in FIG. 8 that signal 944 is divided into six segments 945 which are not of equal width. The resulting acoustic wave 964 thus is likewise formed of six segments which are not of equal width. Moreover, the respective widths of the resulting beam segments 972-982 are also not equal.

It is appreciated that the respective widths of segments 945, can be dynamically arranged and modified to produce beam segments, which, although having different spatial widths, have a generally uniform energy characteristic. Thus the selectable division of acoustic wave 964 into non-uniform segments 945 produces a selectable energy characteristic of each beam 972-982, indicated by the area under output energy graph 984. For example, the dynamic splitting of beam 970 can be such that a relatively small spatial section of a high energy portion of beam 970 is used to produce beam segments 976 and 978, a relatively large spatial section of a low energy portion of beam 970 is used to produce beam segments 972 and 982, and an intermediate size spatial portion of beam 970 is used to produce beam segments 974 and 980. Energy uniformity is seen in histogram 990.

Thus, energy uniformity of output beam segments may be controlled and made generally uniform by distributing energy among beam segments 972-982, generally without attenuating the energy of input beam 970. Moreover, energy uniformity may be controlled independently of the number of beam segments 984 into which beam 970 is split, or the direction of deflection of respective beam segments. In accordance with an embodiment of the invention, suitable optics (not shown) are provided downstream of AOD 960 in order to accommodate and control the respective diameters of beam-segments 972-982, each of which have a different width, but generally uniform energy distribution.

In FIG. 8 it is also seen that the energy distribution among beam segments 972-982 may be varied between pulses 924. Thus in the graphs associated with pulse 936, segments 1005 of control signal 946 have been made generally uniform. As a result, the spatial width of each of the beam segments 950 resulting from acoustic wave 966 is generally uniform, however the energy distribution among the beam segments resulting from interaction of acoustic wave 966 and beam 970 is not uniform, as shown by histogram 1010.

Uniformity of an energy characteristic among beam segments formed by an acoustic wave 966 may be improved, for example by providing a beam shaping element (not shown) external to AOD 960 and operative to shape the energy profile of input beam 970. Alternatively, the power of acoustic wave 966 at various segments 1015, represented by convention as an amplitude, may be varied. In generally an increase power of acoustic wave 966 results in a higher transmissivity through an AOD, namely a relatively greater portion of energy passes through AOD 960. Thus in order to provide sub-beams 950, and 972-982 having a generally uniform energy characteristic, an energy characteristic of beam segments which are formed from a spatial portion of 970 having a relatively high energy level may be attenuated by reducing thereat the power of acoustic wave 966.

FIGS. 9A and 9B are illustrations of varying the number of uniform diameter laser beams produced by a dynamic beam splitter in the system and functionality of FIGS. 1 and 2. As seen in FIGS. 9A and 9B a beam size modifier 1120 is provided to selectably change the size of an input beam 1170 impinging on an AOD 1130. The beam size modifier may be, for example, a beam expander, zoom lens or cylindrical telescope.

As seen in FIG. 9A, a modified size beam 1172 is output from beam size modifier 1120. In the example seen in FIG. 9A, the modified size beam 1172 impinges on only a portion of AOD 1130, thereby reducing an operative portion of AOD 1130. A control signal 1136 is provided to form an acoustic wave 1138 in AOD 1130, which in turn is operative to selectably split modified size beam 1172 into two beam segments 1150 each having, for example, a standardized modular size.

As seen in FIG. 9B, a modified size beam 1182 is output from beam size modifier 1120. In the example seen in FIG. 9B, the size of beam 1182 is different from beam 1172, is substantially not modified respective of beam 1170 and impinges on substantially and entire operative portion of AOD 1130. A control signal 1146 is provided to form an acoustic wave 1148 in AOD 1130, which in turn is operative to selectably split beam 1182 into six beam segments 1190. Each of beam segments have, for example, a standardized modular size corresponding to the size of beam segments 1150.

Figure 10A:
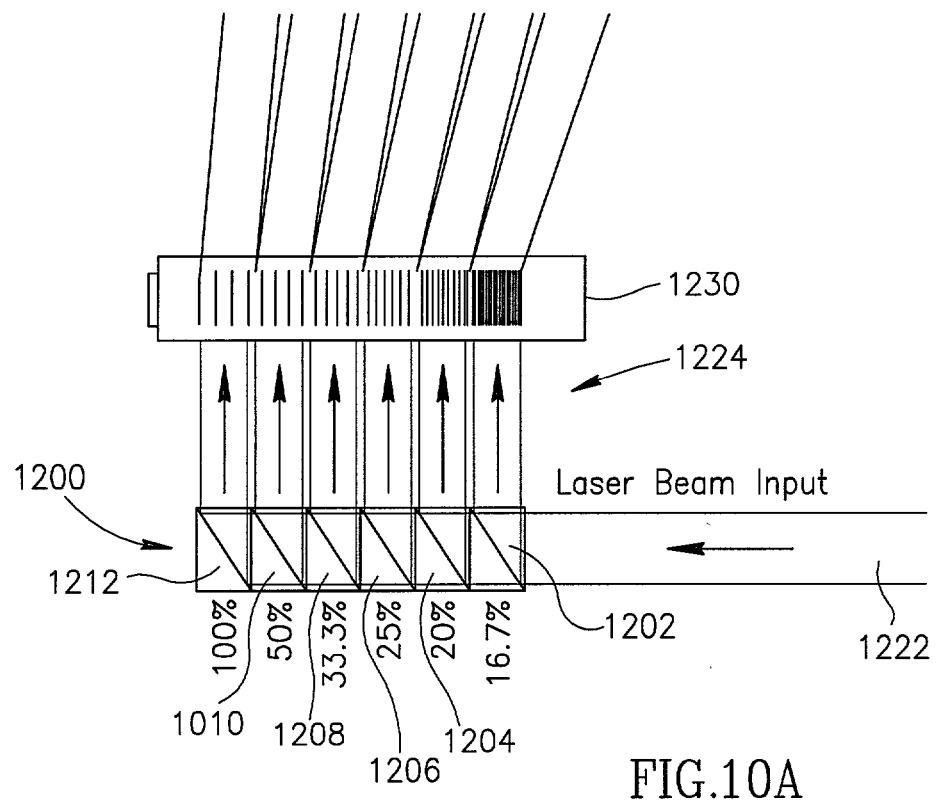
FIGS. 10A and 10B are illustrations showing the result of varying the number of uniform diameter laser beams produced by a dynamic beam splitter as shown in FIGS. 9A and 9B in accordance with a preferred embodiment of the present invention.
Figure 10B:
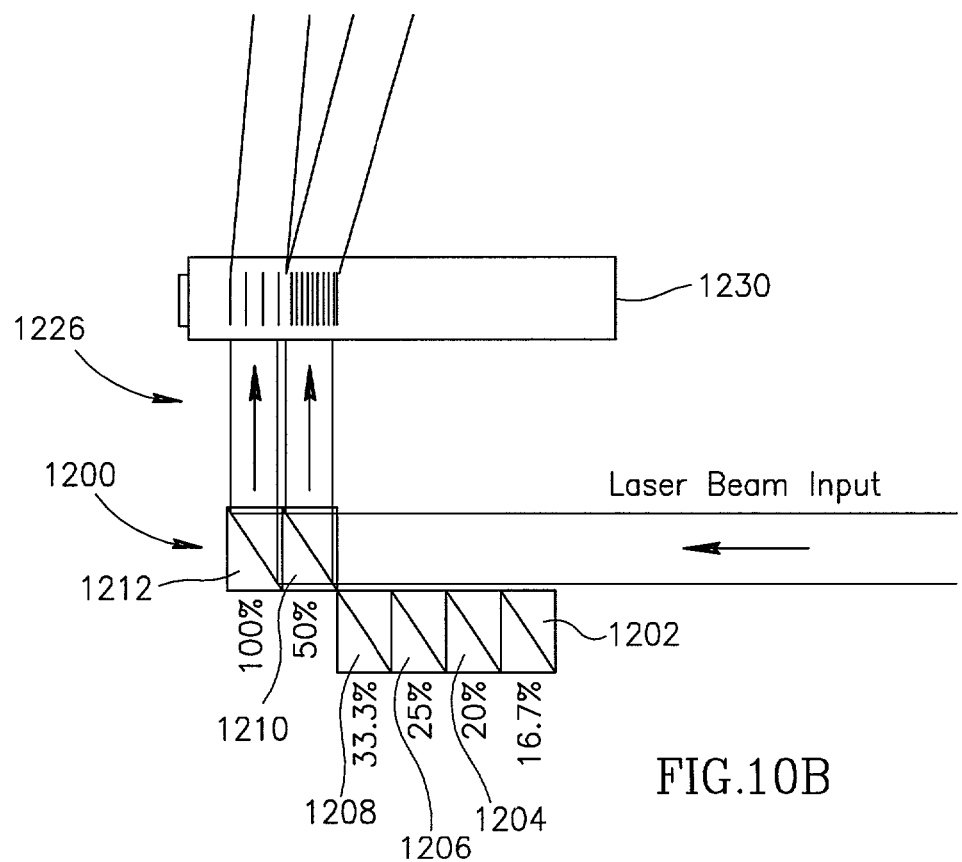

FIGS. 10A and 10B are an illustration of varying the number of uniform diameter laser beams produced by a dynamic beam splitter as shown in FIG. 9 in accordance with a preferred embodiment of the present invention. An array 1200 of partially transmissive beam splitter elements 1202-1212 is provided in cascade to produce a plurality of separated beam segments, which are provided to a dynamic beam deflector 1230.

The transmissivity of each beam splitter element is determined as a function of its location relative to a last beam splitter element in the array. Thus, as seen in FIGS. 10A and 10B, a first beam splitter element 1202 deflects 16.7% of the input beam, a second beam splitter element 1204 deflects 20% of the input beam reaching it, a third beam splitter element 1206 deflects 25% of the input beam reaching it, a fourth beam splitter element 1208 deflects 33.3% of the input beam reaching it, a fifth beam splitter element 1210 deflects 50% of the input beam reaching it, and a sixth and last beam splitter element 1212 deflects 100% of the input beam reaching it.

As seen in FIG. 10A, all of the beam splitter elements 1202-1212 are positioned in line to receive a laser input beam 1222, and a plurality of six distinct beam segments 1224, each having about 16.7% of the total energy in input beam 1222, are output to impinge on a dynamic beam deflector 1230. A spatially sectioned acoustic wave 1238 is formed in AOD 1230 and is operative to dynamically deflect each of beam segments 1222, generally as described hereinabove.

As seen in FIG. 10B, beam splitter elements 1202-1208 are out of the optical path of laser input beam 1222, such that beam 1222 first impinges on beam splitter element 1210. Only two distinct beam segments 1226, each having about 50% of the total energy in input beam 1222, are output to impinge on a dynamic beam deflector 1230. A spatially sectioned acoustic wave 1238 is formed in AOD 1230 and is operative to dynamically deflect each of beam segments 1222, generally as described hereinabove.

It is noted, from the foregoing description with respect to FIGS. 5-10B, that an a dynamic deflector comprises an AOD and is operative to perform at least on of the following functionalities: selectably split an input beam into a selectable number of output beams, to select an energy characteristic of the output beams, and to direct the output beams each at a selectable angle.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

What is claimed is:

1. A system for delivering energy to a substrate, comprising:

a first element comprising at least one dynamically directable source of radiant energy providing a plurality of beams of radiation, each of said beams propagating in an independently-selectable direction, at least one of said beams among said plurality of beams propagating in a direction that is selectable independently of a direction at which another beam in said plurality of beams propagates;

a control system programmed to change said independently-selectable direction in a non-ordered manner in response to a control signal; and a second element, different from said first element, comprising a plurality of independently positionable beam steering elements, situated downstream of said first element comprising said dynamically directable source of radiant energy, some of said beam steering elements receiving said plurality of beams from said first element and directing them to selectable locations on said substrate.

2. The system claimed in claim 1 and wherein said at least one dynamically directable source of radiant energy comprises a pulsed source of radiant energy outputting a plurality of beams each defined by pulses of radiant energy.

3. The system claimed in claim 1 and wherein said at least one source of radiant energy comprises at least one pulsed laser and wherein said plurality of beams of radiation include at least one pulsed laser beam.

4. The system claimed in claim 3 and wherein said at least one pulsed laser is a Q-switched laser.

5. The system claimed in claim 1 and wherein said at least one dynamically directable source of radiant energy comprises a Q-switched laser.

6. The system claimed in claim 1 and wherein said at least one dynamically directable source of radiant energy comprises a beam splitter receiving a beam of radiant energy and splitting said beam into a selectable number of sub-beams.

7. The system claimed in claim 1 and wherein said at least one dynamically directable source of radiant energy comprises a beam splitter receiving a beam of radiant energy, splitting said beam into a plurality of sub-beams and directing said sub-beams each selectable directions.

8. The system claimed in claim 6 and wherein said beam splitter is operative to direct said sub-beams in selectable directions.

9. The system claimed in claim 8 and wherein said beam splitter comprises an acousto-optical deflector whose operation is governed by a control signal.

10. The system claimed in claim 9 and wherein said acousto-optical deflector comprises an acoustic wave generator controlled by said control signal, said acoustic wave generator generating an acoustic wave which determines said number of sub-beams.

11. The system claimed in claim 9 and wherein said acousto-optical deflector comprises an acoustic wave generator controlled by said control signal, said acoustic wave generator generating an acoustic wave which determines said selectable directions of said sub-beams.

12. The system claimed in claim 10 and wherein said acoustic wave also determines said selectable directions of said sub-beams.

13. The system claimed in claim 12 and wherein said acoustic wave includes a plurality of spatially distinct acoustic wave segments, each spatially distinct acoustic wave segment being defined by a portion of said control signal having a distinct frequency.

14. The system claimed in claim 13 and wherein said each spatially distinct acoustic wave segment determines a corresponding spatially distinct direction of a corresponding sub-beam, said direction being a function of the frequency of the portion of the control signal corresponding to said acoustic wave segment.

15. The system claimed in claim 13 and wherein the number of said spatially distinct acoustic wave segments determines the number of corresponding sub-beams.

16. The system claimed in claim 2 and wherein:
said at least one dynamically directable source of radiant energy comprises a dynamically configurable beam splitter receiving a beam of radiant energy and splitting said beam into a selectable number of sub-beams, said dynamically configurable beam splitter being capable of changing at least one of the number and direction of said sub-beams within a reconfiguration time duration; and
said pulses of radiant energy are separated from each other in time by a time separation which is greater than said reconfiguration time duration.

17. The system claimed in claim 2 and wherein: said plurality of independently positionable beam steering elements being capable of changing the direction of said sub-beams within a redirection time duration; and
said pulses of radiant energy are separated from each other in time by a time separation which is less than said redirection time duration.

18. The system claimed in claim 16 and wherein:
said plurality of independently positionable beam steering elements being capable of changing the direction of said sub-beams within a redirection time duration; and
said pulses of radiant energy are separated from each other in time by a time separation which is less than said redirection time duration.

19. The system claimed in claim 3, wherein each of said plurality of beam steering elements comprises a reflector mounted on at least one selectably tilting actuator and wherein said at least one actuator comprises a piezoelectric device.

20. The system claimed in claim 3, wherein each of said plurality of beam steering elements comprises a reflector mounted on at least one selectably tilting actuator and wherein said at least one actuator comprises a MEMs device.

21. The system claimed in claim 18 and wherein said plurality of beam steering elements includes a number of beam steering elements which exceeds the number of sub-beams included in said plurality of sub-beams and wherein at least some of said plurality of sub-beams are directed to at least some of said plurality of beam steering elements while others of said plurality of said beam steering elements are being repositioned.

22. The system claimed in claim 6 and wherein said selectable number of sub-beams all lie in a plane.

23. The system claimed in claim 1 and wherein said plurality of independently positionable beam steering elements comprises a two dimensional array of beam steering elements.

24. The system claimed in claim 23 and further comprising an array of fixed deflectors optically interposed between said at least one dynamically directable source of radiant energy and said plurality of independently positionable beam steering elements.

25. The system claimed in claim 1 wherein said independently positionable beam steering elements are operative to direct said beams of radiation to remove a portion of said substrate at said locations.

26. The system claimed in claim 2 and wherein at least one independently positionable beam steering element is configured to be positionable at least partly during a time interval between pulses of said plurality of beams.

27. The system claimed in claim 3 and wherein at least one independently positionable beam steering element is configured to be independently positionable at least partly during a time interval between pulses defining said at least one pulsed laser beam.

28. The system claimed in claim 1, wherein the independently-selectable direction of each of said beams is selectable from a range of three or more angles.

29. A system for delivering energy to a substrate, comprising:
- at least one source of radiant energy providing a beam of radiation;
- a first element comprising a beam splitter operative to split said beam into a plurality of sub-beams, said sub-beams propagating in at least one dynamically selectable direction, at least one of said beams among said plurality of sub-beams propagating in a direction that is selectable independently of a direction at which another sub-beam in said plurality of sub-beams propagates; and
- a second element, different from said first element, comprising a plurality of independently positionable beam steering elements, situated downstream of said first element comprising said beam splitter, some of said steering elements receiving said plurality of sub-beams from said first element and directing them to selectable locations on said substrate.

30. The system claimed in claim 29 and wherein said at least one source of radiant energy comprises a pulsed source of radiant energy and said beam is defined by pulses of radiant energy.

31. The system claimed in claim 29 and wherein said at least one source of radiant energy comprises at least one pulsed laser and wherein said beam of radiation includes a pulsed laser beam.

32. The system claimed in claim 31 and wherein said at least one pulsed laser is a Q-switched laser.

33. The system claimed in claim 29 and wherein said at least one source of radiant energy comprises a Q-switched laser.

34. The system claimed in claim 29 and wherein said plurality of sub-beams comprises a selectable number of sub-beams.

35. The system claimed in claim 34 and wherein said beam splitter comprises an acousto-optical deflector whose operation is governed by a control signal.

36. The system claimed in claim 35 and wherein said acousto-optical deflector comprises an acoustic wave generator controlled by said control signal, said acoustic wave generator generating an acoustic wave which determines said number of sub-beams.

37. The system claimed in claim 35 and wherein said acousto-optical deflector comprises an acoustic wave generator controlled by said control signal, said acoustic wave generator generating an acoustic wave which determines said selectable directions of said sub-beams.

38. The system claimed in claim 36 and wherein said acoustic wave also determines said selectable directions of said sub-beams.

39. The system claimed in claim 38 and wherein said acoustic wave includes a plurality of spatially distinct acoustic wave segments, each spatially distinct acoustic wave segment being defined by a portion of said control signal having a distinct frequency.

40. The system claimed in claim 39 and wherein said each spatially distinct acoustic wave segment determines a corresponding spatially distinct direction of a corresponding sub-beam, said direction being a function of the frequency of the portion of the control signal corresponding to said acoustic wave segment.

41. The system claimed in claim 39 and wherein the number of said spatially distinct acoustic wave segments determines the number of corresponding sub-beams.

42. The system claimed in claim 30 and wherein:
said beam splitter comprises a dynamically configurable beam splitter receiving said beam;
said plurality of sub-beams is a selectable number of sub-beams;
said dynamically configurable beam splitter being capable of changing at least one of the number and direction of said sub-beams within a reconfiguration time duration; and
said pulses of radiant energy are separated from each other in time by a time separation which is greater than said reconfiguration time duration.

43. The system claimed in claim 30 and wherein:
said plurality of independently positionable beam steering elements being capable of changing the direction of said sub-beams within a redirection time duration; and
said pulses of radiant energy are separated from each other in time by a time separation which is less than said redirection time duration.

44. The system claimed in claim 42 and wherein:
said plurality of independently positionable beam steering elements being capable of changing the direction of said sub-beams within a redirection time duration; and
said pulses of radiant energy are separated from each other in time by a time separation which is less than said redirection time duration.

45. The system claimed in claim 31, wherein each of said plurality of beam steering elements comprises a reflector mounted on at least one selectably tilting actuator and wherein said at least one actuator comprises a piezoelectric device.

46. The system claimed in claim 31, wherein each of said plurality of beam steering elements comprises a reflector mounted on at least one selectably tilting actuator and wherein said at least one actuator comprises a MEMs device.

47. The system claimed in claim 44 and wherein said plurality of beam steering elements includes a number of beam steering elements which exceeds the number of sub-beams included in said plurality of sub-beams and wherein at least some of said plurality of sub-beams are directed to at least some of said plurality of beam steering elements while others of said plurality of said beam steering elements are being repositioned.

48. The system claimed in claim 34 and wherein said selectable number of sub-beams all lie in a plane.

49. The system claimed in claim 29 and wherein said plurality of independently positionable beam steering elements comprises a two dimensional array of beam steering elements.

50. The system claimed in claim 49 and further comprising an array of fixed deflectors optically interposed between said at least one source of radiant energy and said plurality of independently positionable beam steering elements.

51. The system claimed in claim 29 wherein said independently positionable beam steering elements are operative to direct said beams of radiation to remove a portion of said substrate at said locations.

52. The system claimed in claim 30 and wherein at least one independently positionable beam steering element is configured to be positionable at least partly during a time interval between said pulses of radiant energy.

53. The system claimed in claim 31 and wherein at least one independently positionable beam steering element is configured to be independently positionable at least partly during a time interval between pulses defining said pulsed laser beam.

54. The system claimed in claim 29, wherein the at least one dynamically selectable direction is selectable from a range of three or more angles.

55. A system for delivering energy to a substrate, comprising:
- a first element comprising at least one dynamically directable source of radiant energy providing a plurality of beams of radiation, each beam propagating in an independently-selectable direction; and
- a second element, different from said first element, comprising a plurality of independently positionable beam steering elements, situated downstream of said first element comprising said at least one dynamically directable source of radiant energy, each comprising a reflector mounted on at least one selectably tilting actuator and configured to be independently positionable along at least two non-parallel axes, at least some of said beam steering elements receiving said plurality of beams from said first element and directing them to selectable locations on said substrate.

56. The system claimed in claim 55, wherein the independently-selectable direction of each of said beams is selectable from a range of three or more angles.

57. A system for delivering energy to a substrate, comprising:
- at least one source of radiant energy providing a beam of radiation;
- a first element, comprising a beam splitter operative to split said beam into a plurality of sub-beams, each sub-beam propagating in an independently-selectable direction; and
- a second element, different from said first element, comprising a plurality of independently positionable beam steering elements, situated downstream of said first element comprising said beam splitter, each comprising a reflector mounted on at least one selectably tilting actuator and configured to be independently positionable along at least two non-parallel axes, at least some of said steering elements receiving said plurality of sub-beams from said first element and directing them to selectable locations on said substrate.

58. The system claimed in claim 57, wherein the independently-selectable direction of each of said beams is selectable from a range of three or more angles.

59. The system claimed in claim 57, further comprising a mapping assembly, disposed along an optical path of the plurality of sub-beams, between said beam splitter and said plurality of independently positionable beam steering elements, wherein said mapping assembly directs each sub-beam incident thereon onto one of the plurality of independently positionable beam steering elements.

\* \* \* \* \*